United States Patent
Essers

(10) Patent No.: US 6,590,210 B1
(45) Date of Patent: Jul. 8, 2003

(54) SCANNING ELECTRON MICROSCOPE

(76) Inventor: Erik Essers, Brunnenstrasse 2/1, D-73430 Aalen (DE)

(*) Notice: Subject to any disclaimer, the term of this patent is extended or adjusted under 35 U.S.C. 154(b) by 0 days.

(21) Appl. No.: 09/623,824

(22) PCT Filed: Mar. 10, 1999

(86) PCT No.: PCT/EP99/01544

§ 371 (c)(1),
(2), (4) Date: Sep. 8, 2000

(87) PCT Pub. No.: WO99/46797

PCT Pub. Date: Sep. 16, 1999

(30) Foreign Application Priority Data

Mar. 10, 1998 (DE) .......................................... 198 10 301
Oct. 1, 1998 (DE) .......................................... 198 45 329

(51) Int. Cl.[7] .............................................. H01J 37/28
(52) U.S. Cl. ...................................... 250/310; 250/397
(58) Field of Search ................................. 250/310, 397

(56) References Cited

U.S. PATENT DOCUMENTS

| | | | | |
|---|---|---|---|---|
| 4,897,545 A | * | 1/1990 | Danilatos ..................... | 250/310 |
| 5,362,964 A | | 11/1994 | Knowles et al. ............. | 250/310 |
| 5,396,067 A | | 3/1995 | Suzuki et al. ................ | 250/310 |
| 5,412,209 A | | 5/1995 | Otaka et al. ................. | 250/310 |
| 5,412,211 A | | 5/1995 | Knowles ...................... | 250/310 |
| 5,677,531 A | | 10/1997 | Miyazaki ..................... | 250/310 |

FOREIGN PATENT DOCUMENTS

| | | |
|---|---|---|
| DE | 3638682 A1 | 5/1988 |
| DE | 3703028 A1 | 9/1988 |
| DE | 4236273 A1 | 7/1993 |
| DE | 19549022 A1 | 7/1996 |
| DE | 19605855 A1 | 8/1997 |
| EP | 0767482 A2 | 4/1997 |
| EP | 0790634 A1 | 8/1997 |
| EP | 0817235 A1 | 1/1998 |
| WO | WO 88/09564 | 12/1988 |
| WO | WO 90/04261 | 4/1990 |
| WO | WO 97/07526 | 2/1997 |
| WO | WO 98/40906 | 9/1998 |

OTHER PUBLICATIONS

Danilatos, G.D., Design and Construction of an Environmental SEM (Part 4), Scanning vol. 12 (1990), pp. 23–27.

* cited by examiner

Primary Examiner—Jack Berman
(74) Attorney, Agent, or Firm—Robert A. Koons, Jr.; Matthew P. McWilliams; Buchanan Ingersoll, P.C.

(57) ABSTRACT

With a scanning electron microscope having an electron gun and a specimen chamber between which one or more pressure stage apertures are arranged, through whose orifices a primary electron beam can be deflected to a specimen in the specimen chamber, where the lowest pressure stage aperture (18) nearest the specimen, through which the primary electron beam strikes the specimen, is set up to shield an elevated pressure in the specimen chamber with respect to the remaining microscope column of the scanning electron microscope and to allow secondary electrons emanating from the specimen to pass through their orifice to reach at least one detector, the detector is a high-sensitivity detector (74) biased at a positive potential with respect to the specimen. At least one electrode (44, 55) which is at a positive potential with respect to the pressure stage aperture (18) and is adapted to deflect the secondary electrons from the specimen to the detector (74) may be arranged above the bottom pressure stage aperture (18). As an alternative, the scanning electron microscope is equipped for detection of secondary electrons through the orifice of at least one pressure stage aperture which is constructed in layers of at least two conductive layers which are electrically insulated from one another and can be biased with potentials.

65 Claims, 8 Drawing Sheets

SCANNING ELECTRON MICROSCOPE

DESCRIPTION

Figure 1:
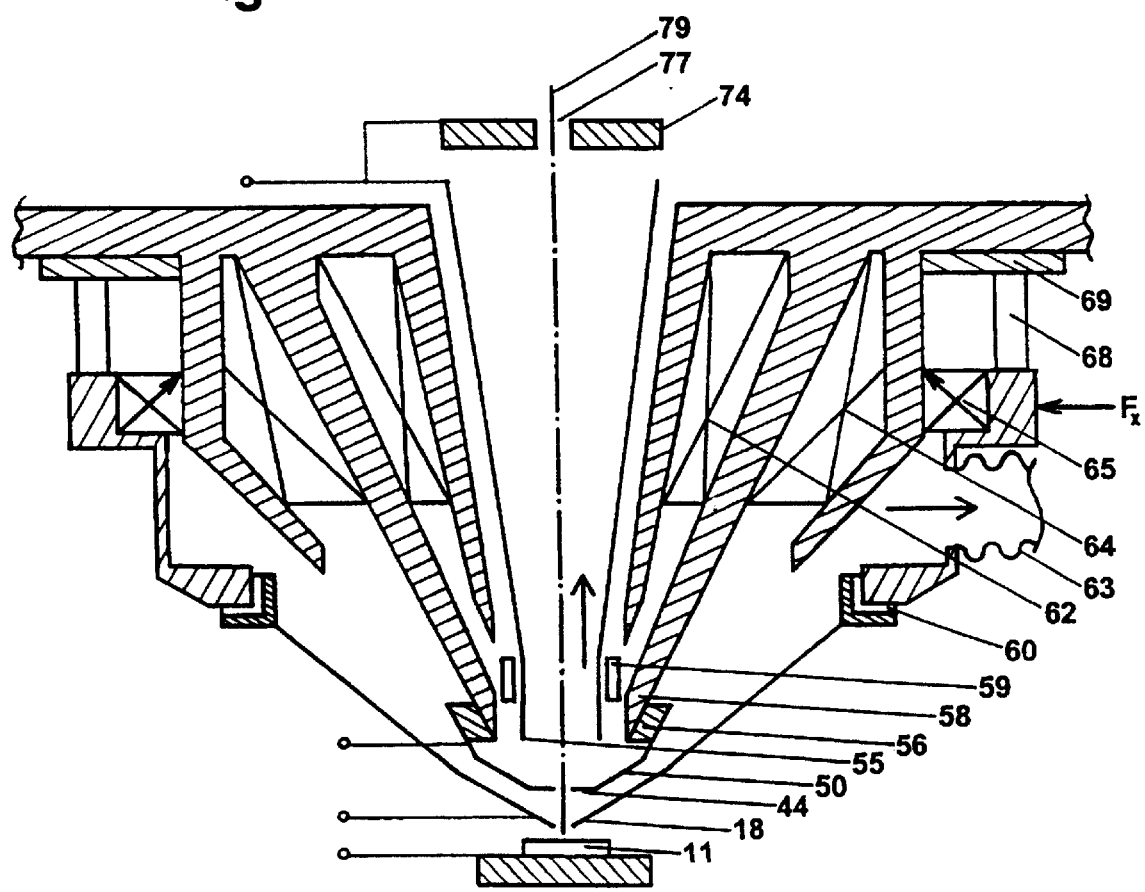

This invention relates to a scanning electron microscope (SEM), in particular a scanning electron microscope operating under a slightly elevated pressure, or retrofitting a scanning electron microscope that operates in vacuo for operation with gas in the specimen chamber, and in particular it relates to an improved detection efficiency of such a microscope (i.e., improving the signal-to-noise ratio of the images recorded with it), in particular in operation with a low primary energy.

With a scanning electron microscope that operates under a slightly elevated pressure (pressure SEM), a maximum operating pressure of a few hectopascals to a few kilopascals is usually allowed in the specimen chamber. At this pressure, the primary electrons have only a short mean free path length. Therefore, the microscope column is sealed with respect to the specimen chamber by a pressure stage aperture (or a pressure limiting aperture) through which the primary electron beam enters the specimen chamber. Above this pressure stage aperture, the pressure is reduced by several powers of ten.

The backscatter electrons emitted by the specimen can be detected with a scintillator-light guide combination arranged between the specimen and the pressure stage aperture. An improved resolution, however, is obtained when using the secondary electrons which are emitted by the specimen and can be detected with the help of a collector electrode (PCT Patent application WO 88/09564 A1). The bottom side of the pressure stage aperture is usually designed as a collector electrode or a separate collector electrode may be arranged beneath the pressure stage aperture.

With other scanning electron microscopes which operate under a slightly elevated pressure, the secondary electrons are detected through the opening in the pressure stage aperture in a type of antechamber which is sealed toward the top with respect to the lens by another pressure stage aperture. Here again, a collector electrode is used as the detector for the secondary electrons (PCT Patent application WO 90/04261 A1). Although this design has been tested (G. D. Danilatos, "Design and Construction of an Environmental SEM; Part 4" Scanning, vol. 12 (1990) p. 23), it has not been successful in practice.

Detector systems with collector electrodes have a poor detection sensitivity because of the noise with the subsequent electronic amplification, and therefore they require pre-amplification of the secondary electron signal before it reaches the collector electrode. This pre-amplification takes place with the help of an electric field between the specimen and the collector electrode which accelerates the secondary electrons emitted by the specimen so that they can ionize gas molecules. After colliding with the gas molecules, the secondary electrons thus generated in the gas and the secondary electrons already present previously are accelerated again through the electric field and generate additional secondary electrons in the gas. In this way, a secondary electron cascade is induced by the secondary electrons emitted by the specimen and ultimately reaches the collector electrode. Even when using a light guide with a downstream photomultiplier as the gas scintillation detector, a secondary electron cascade is used as the pre-amplifier.

Despite this cascade pre-amplification, in both cases the signal-to-noise ratio of the images recorded at a slightly elevated pressure are much worse at the same beam amperage than with the images recorded with conventional secondary electron detectors without elevated pressure. Therefore, improving detection efficiency and reducing detector noise of pressure SEMs are important goals when investigating sensitive specimens in particular (e.g., semiconductor components, plastics, biological and medical specimens).

In addition, the use of a low primary energy is also advantageous in investigating sensitive specimens so that less energy is applied to the specimen and damage to the specimen due to the electron beam is limited to a thin surface layer. The pressure SEMs known so far need a secondary electron cascade in the gas for their collector electrode and are therefore unsuitable for operation with a low primary energy (1 keV, for example), in particular in observation of wet specimens. For operation with a low primary energy, the shortest possible gas path between the specimen and the pressure stage aperture above it is necessary, as well as the lowest possible pressure above the pressure stage aperture, because with a lower primary energy, the mean free path length of the primary electrons in the gas also decreases. Under these conditions, however, no satisfactory cascade pre-amplification is possible so that the pressure SEMs known in the past can be used in operation with gas in the specimen chamber for observation of wet specimens only above a primary energy of 3 keV. However, even at 3 keV a signal background is produced due to the large amount of scattered primary electrons, resulting in an even worse signal-to-noise ratio in the images than at a higher primary energy. The same is also true in operation with a low primary energy (1.5 keV, for example) which is used with the pressure SEMs known in the past at a pressure up to approximately 1.5 hPa for the purpose of combatting a charge buildup.

The pressure SEMs known today are also not very suitable for a low beam amperage due to the poor detection efficiency and the time constant of the operational amplifier even when using a collector electrode. When investigating wet specimens at a high magnification in particular, a lower beam amperage and a lower primary energy would be important, however, to prevent local heating and the resulting drying out of the specimen location observed.

In addition, there is a demand for a pressure SEM with a good signal-to-noise ratio which would also be suitable for a low primary energy to permit better reproduction of fine surface structures and to prevent the edge effect.

Preventing a charge buildup in operation with a low primary energy is another important problem which is not solved satisfactorily by today's pressure SEMs because of the resulting poor signal-to-noise ratio. Possible applications for corresponding pressure SEMs include, for example, imaging sensitive plastics, use in electron beam lithography and in metrology equipment, such as that used in the semiconductor industry for automated monitoring in production. Instead of that, the influence of charge buildup is reduced today in other metrology equipment by using backscatter electrons for imaging.

The object of this invention is to provide an improved SEM that operates under a slightly elevated pressure (hereinafter: pressure scanning electron microscope or pressure SEM) which does not have the above disadvantages of traditional pressure SEMs, and in particular to improve the detection efficiency of pressure SEMs, where detection takes place through the pressure stage aperture through which the microscope column is closed with respect to the specimen chamber (or the signal-to-noise ratio of the images recorded with it), in particular in operation with a low primary energy.

This object is achieved by an SEM having the features according to Patent Claim 1. Advantageous embodiments of this invention are defined in the dependent claims.

This invention is based in general on the idea of improving upon a scanning electron microscope with the features according to the definition of the preamble of Patent Claim 1 so that a high-sensitivity detector under a positive bias with respect to the specimen is used as the detector.

According to this invention, this object is achieved according to a first aspect in particular by the fact that one or more electrode elements (solid electrodes or thin electrode layers) are arranged above the pressure stage aperture and are at a positive potential with respect to the pressure stage aperture, not using a collector electrode as the detector for the secondary electrons generated in the specimen and in the gas but instead using one or more detectors with a higher detection sensitivity.

The advantage of this invention consists in particular of the fact that, independently of the presence of a secondary electron cascade, a high detection efficiency is achieved for the secondary electrons emitted by the specimen and a low noise of the detector system. With the pressure SEMs according to this invention, the length of the path the primary electrons must travel through the gas can be made very short (<300 µm) by using a short distance between the specimen and the pressure stage aperture and by pumping out sharply above the pressure stage aperture. However, the pressure SEMs known so far are not suitable in principle for such short path lengths (<300 µm) of the primary electrons through the gas, because an adequate secondary electron cascade cannot develop either above or below the pressure stage aperture.

With the good suitability for a short path length of the primary electrons through the gas, in particular two important new fields of applications for pressure SEMs are developed through the pressure SEMs according to this invention and the properties of known applications are improved.

First, as a new application, scanning electron microscopy can be performed at a low primary energy (e.g., 1 keV or lower) with gas in the specimen chamber (e.g., water vapor at a pressure of 10 hPa) with no problem. Because of the high detection efficiency and the low noise of the detector system, only a low beam amperage is necessary. Thus, wet specimens can be observed at higher magnifications than before without the drying out the observed specimen location. In addition, an important improvement on the previous options is achieved by combatting charge buildup in operation with a low primary energy and a good detection efficiency.

Secondly, scanning electron microscopy can be performed with secondary electrons at an unusually high pressure (>100 hPa) with the pressure SEMs according to this invention at a high primary energy (>15 keV). When using a pressure stage aperture with a very small bore diameter (of 20 µm, for example), it is even possible to operate these scanning electron microscopes at ambient pressure (1013 hPa) with extremely small distances (<50 µm) between the specimen and the pressure stage aperture.

In addition, especially at a low primary energy, contamination of the specimen, which is a problem in scanning electron microscopy at a low primary energy, can be counteracted with the help of certain gases (e.g., oxygen or compounds containing oxygen). (Effective purification of the specimen can before examination by scanning electron microscopy be achieved if a high-frequency plasma purification device is integrated into the air lock.)

According to a second aspect of the present invention, a further improvement in the detection efficiency of pressure SEMs, where detection of the secondary electrons takes place through one or more pressure stage apertures, is achieved in particular by increasing the amount of secondary electrons passing through the pressure stage apertures. This component can be increased by constructing at least one pressure stage aperture in layers, namely two or more conductive layers with insulating layers or poor conductors between them, so that the top and bottom sides of the pressure stage aperture can be set at different potentials so that an electric field is created in the pressure stage aperture to improve the transport of the secondary electrons.

The first and second aspects of this invention described above may be implemented jointly or individually to solve the object defined above. In both cases, acceleration of secondary electrons from an area near the specimen with a high pressure to the detector in an area remote from the specimen with a reduced pressure (vacuum) is supported.

With the usual secondary electron detectors with a high detection sensitivity, each individual secondary electron triggers a large number of photons, electrons or electron-hole pairs which are then detected. To do so, it is necessary to supply energy to the secondary electrons before they reach the detector or (with the channel plate or channeltron) along the detector surface. To this end, a high electric voltage must be applied between the specimen and the detector or (in the case of channel plate and channeltron) along the detector surface.

A preferred embodiment of the present invention therefore consists of the fact that the entire detector surface or parts of the detector surface are at a potential which is positive in comparison with the potential of the specimen by more than 500 V, preferably 1000 V. Use of such detectors in the specimen chamber of a traditional pressure SEM would lead to sparkover.

A preferred embodiment of the present invention consists of the fact that the pressure SEM has a combined electrostatic and magnetic lens. In comparison with the purely electrostatic lens (German Patent application DE 3703029 A1) which is easier to manufacture, this is an advantage in particular when the pressure SEM designed in this way is also to be used at both conventional primary energies above 3 keV. In comparison with a purely magnetic lens, a combined electrostatic and magnetic lens is an advantage in particular when the secondary electrons are to be focused through an electric field at the orifice of a pressure stage aperture. Embodiments with a single-pole magnetic lens (e.g., according to the lenses described in European Patent application EP 0790634 A1, German Patent application DE 4236273 A1, European Patent applications EP 0767482 A2 and EP 0817235 A1) yield especially good resolution and an especially good detection efficiency as important advantages, in particular for investigating non-magnetic specimens.

The improved detection efficiency comes about due to an increase in the amount of secondary electrons generated in the specimen and in the gas and reaching the detector through the pressure stage apertures. When using a single-pole magnetic lens, this component is increased because the secondary electrons travel on spiral paths around the magnetic field lines passing through the orifices of the pressure stage apertures. In the gas of the specimen chamber, the secondary electrons are moved by collisions to new spiral paths around adjacent field lines, although these usually also pass through the orifices of the pressure stage apertures when the magnetic field strength is sufficient.

Implementation of this invention is not limited to pressure SEMs but instead it can also be implemented by retrofitting SEMs that would normally be operated with the specimen chamber evacuated. The ease in converting the equipment between the two applications is one advantage of this invention.

Figure 2:
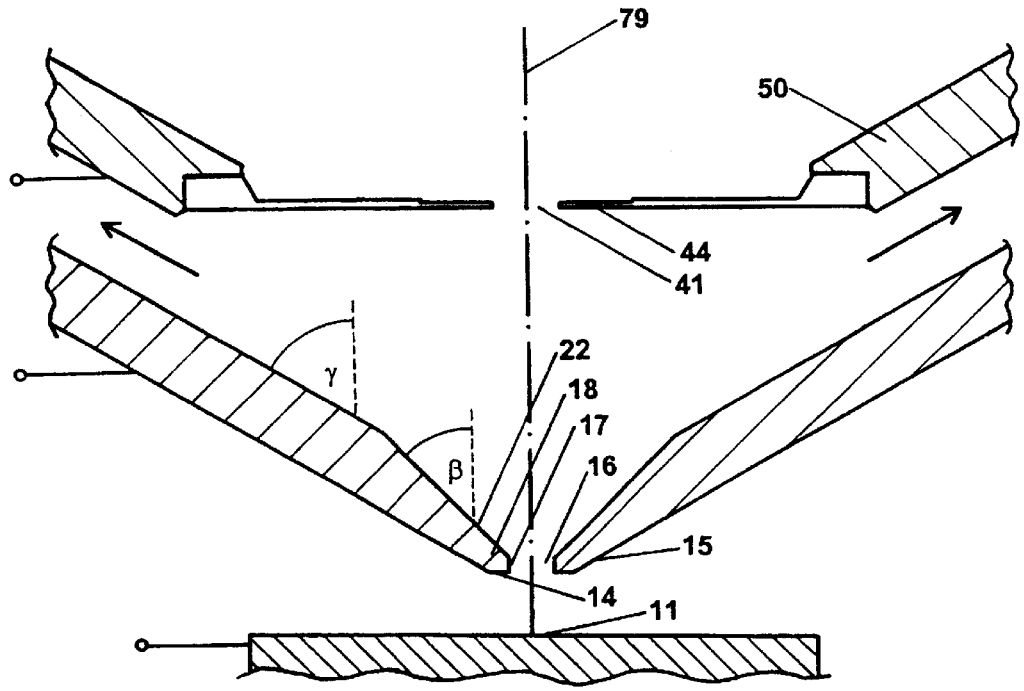
Figure 3:
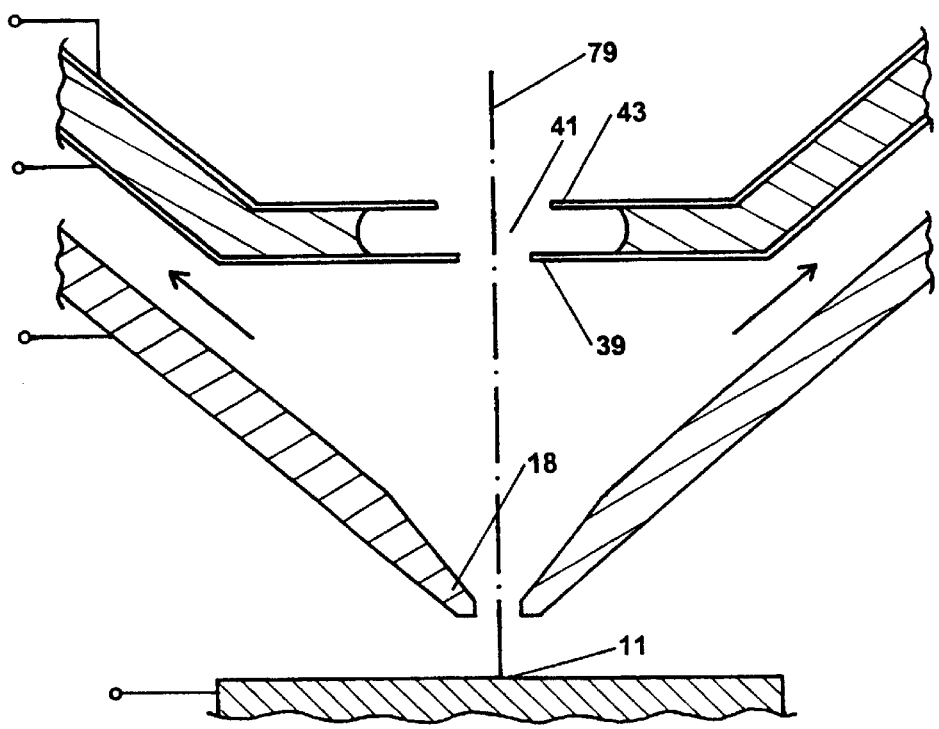
Figure 4:
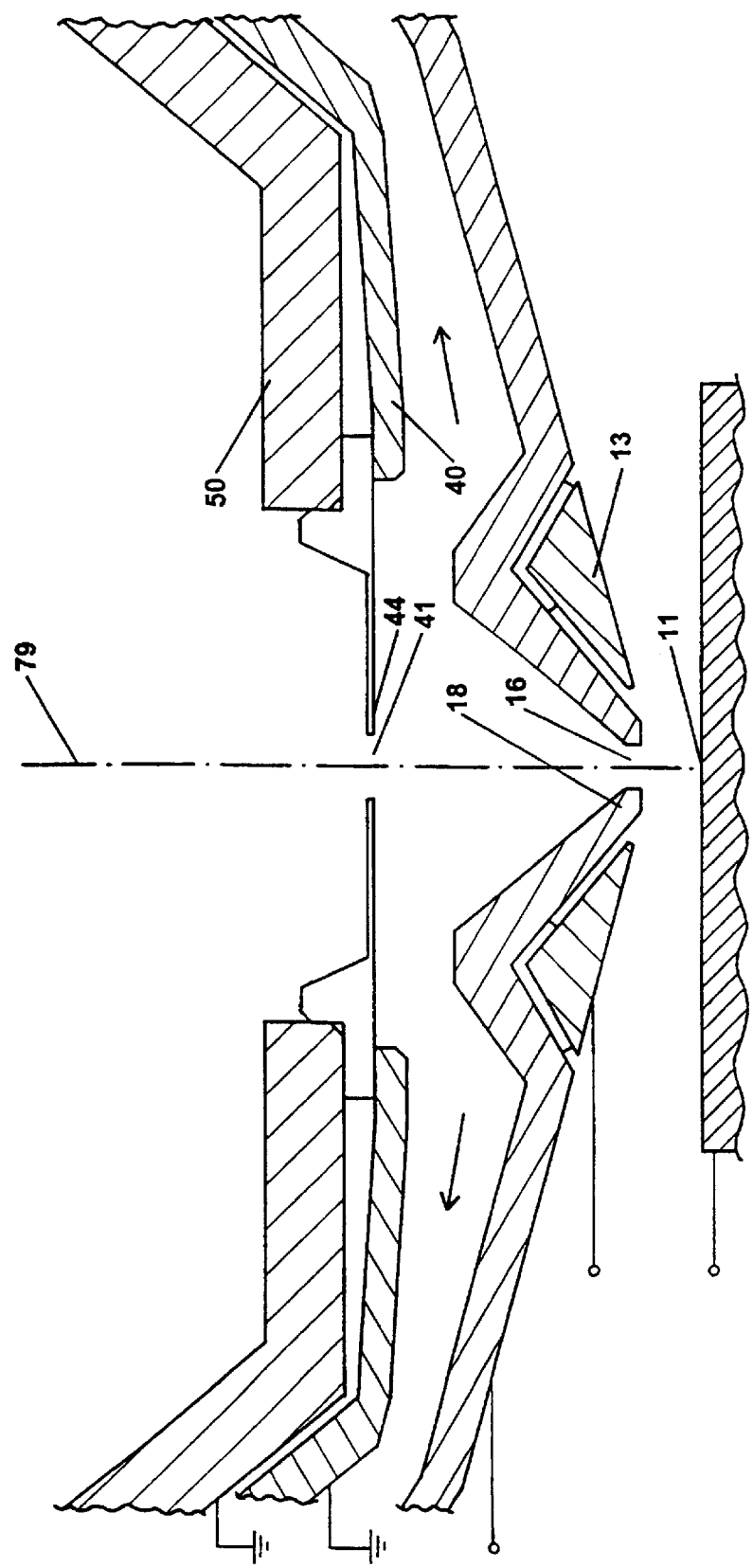
Figure 5:
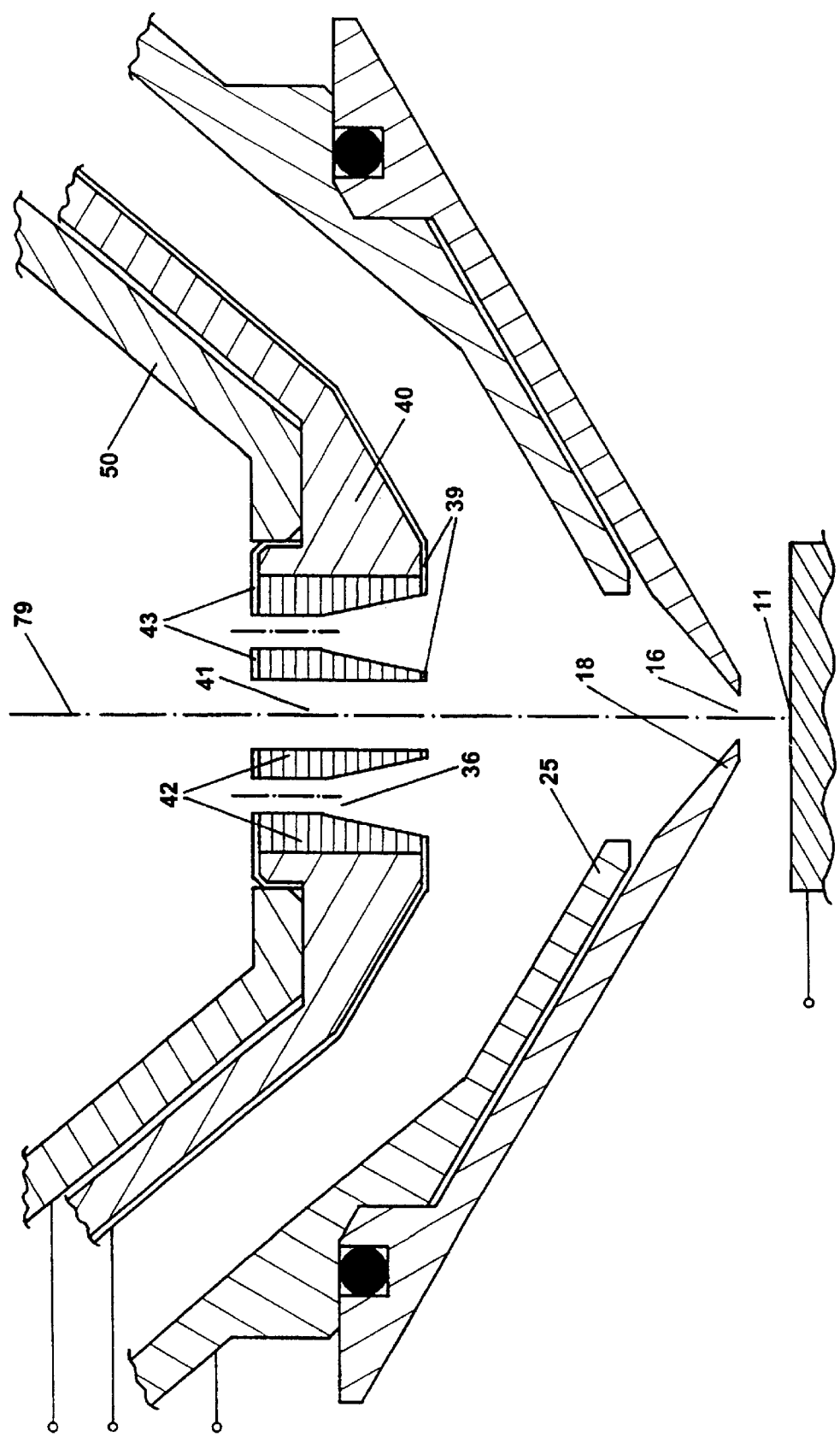
Figure 6:
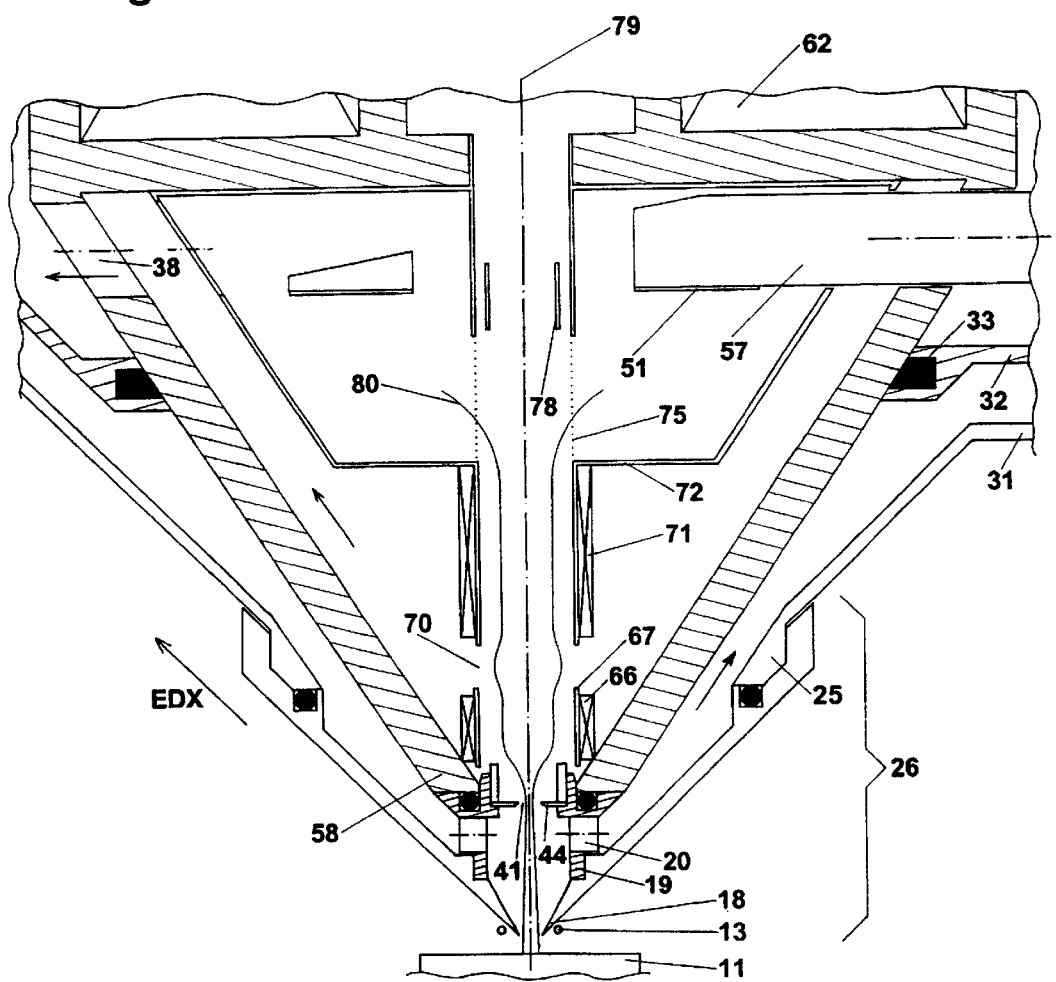
Figure 7:
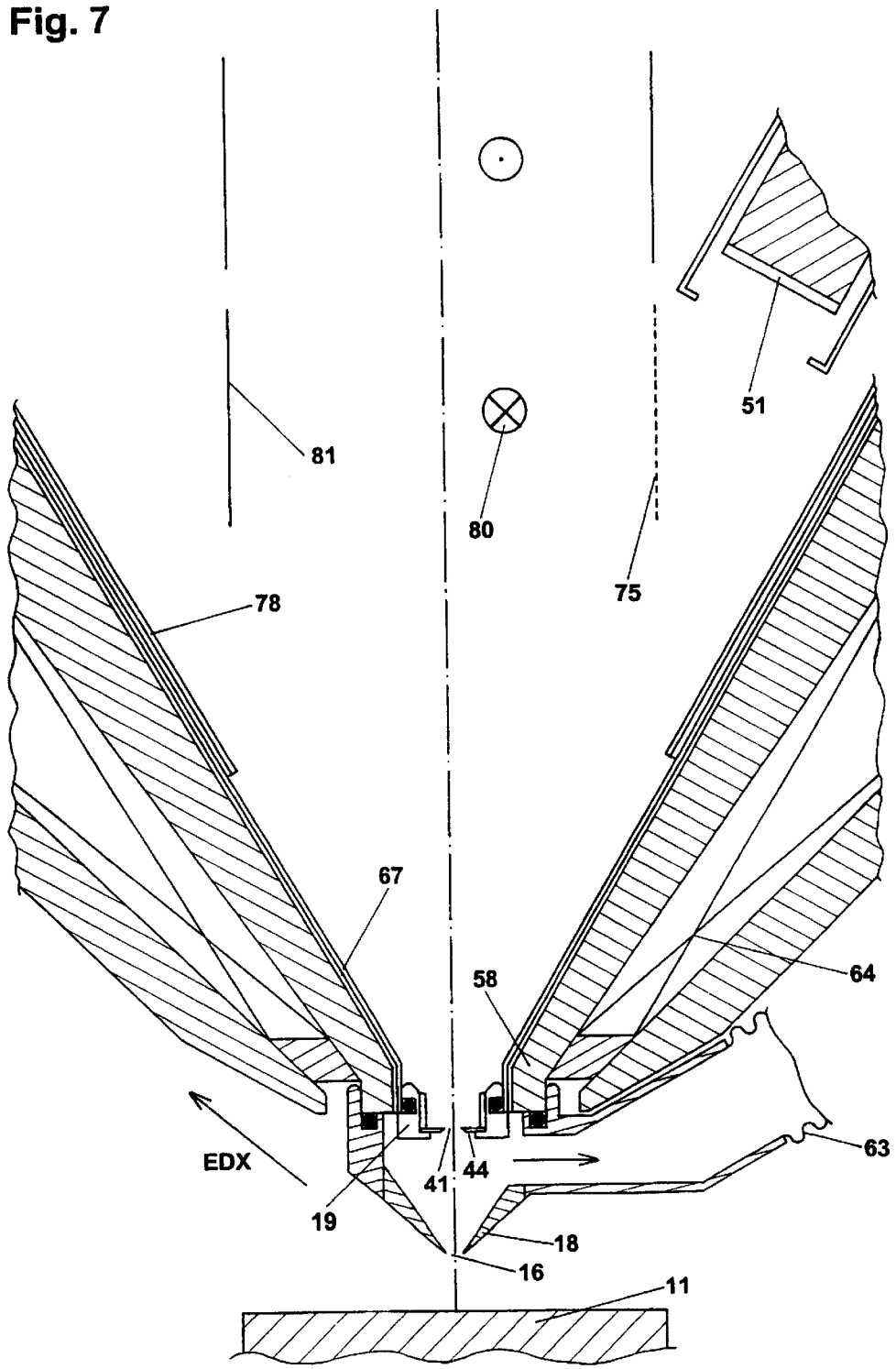
Figure 8:
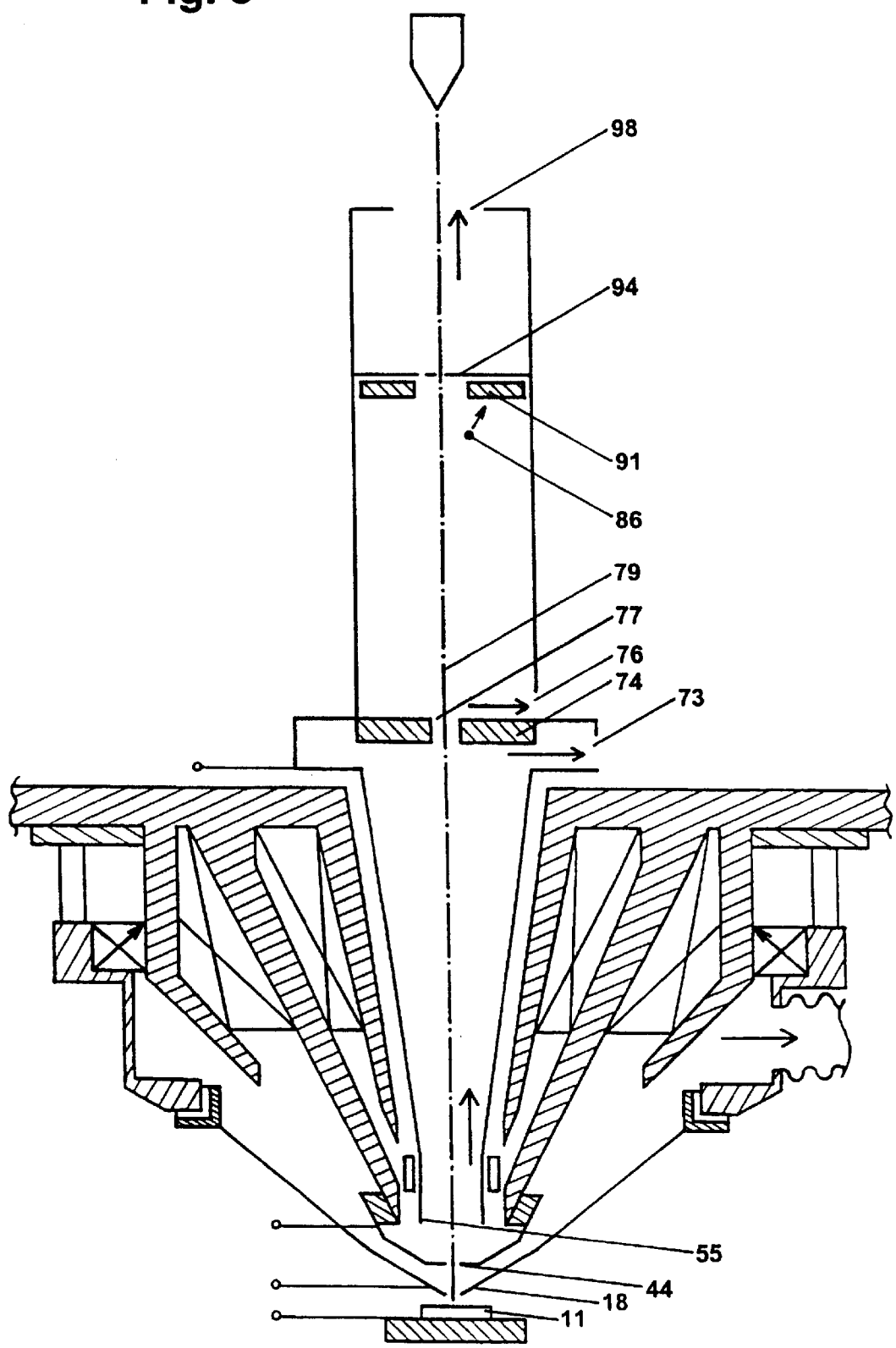
Figure 9:
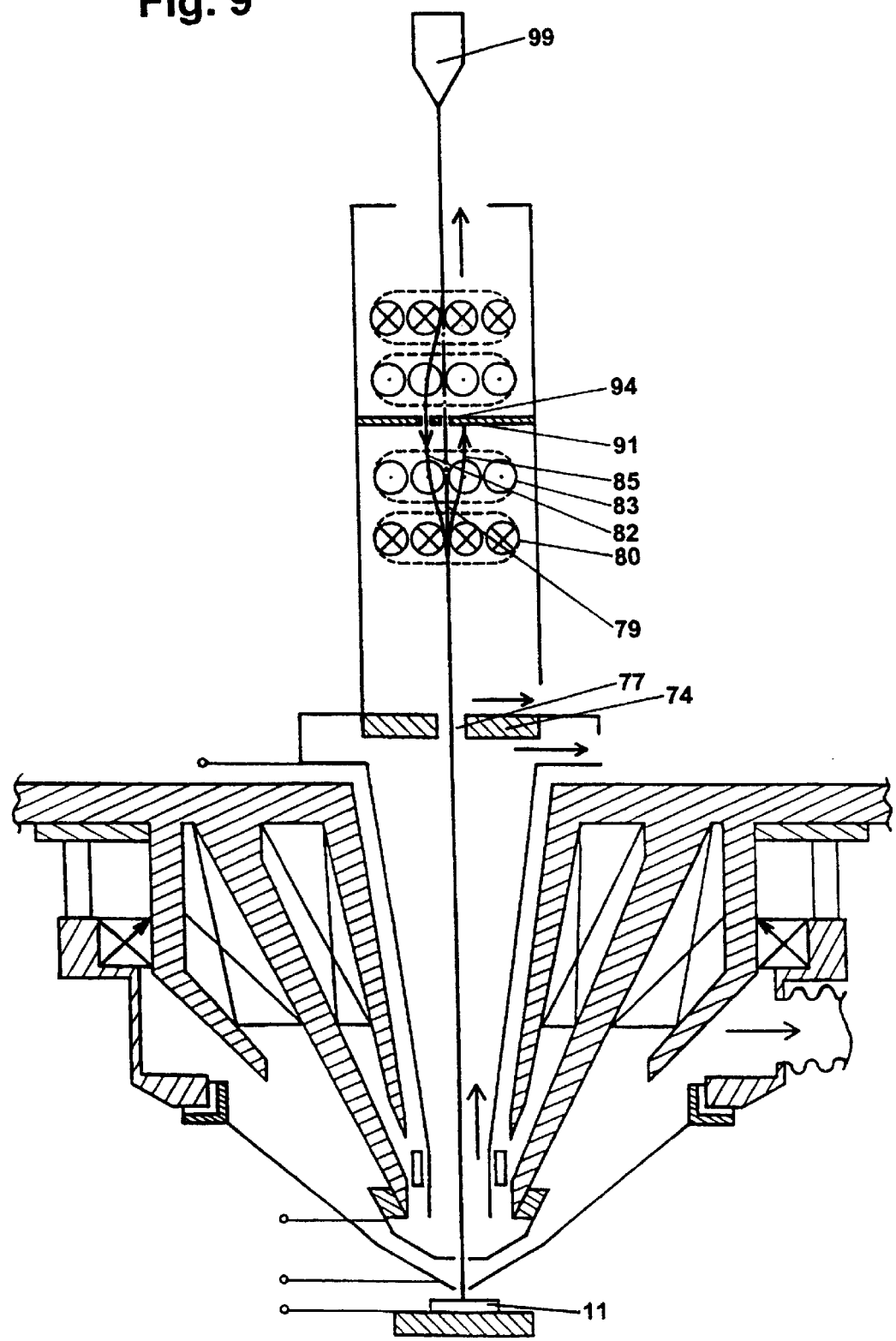

Additional embodiments and advantages of this invention are shown in the accompanying drawings and their description; they show:

FIG. 1: a schematic diagram of an arrangement according to this invention of pressure stage apertures, lens, electrodes and detector for a pressure SEM;

FIG. 2: a detail from FIG. 1 illustrating the pressure stage apertures;

FIG. 3: like FIG. 2, a schematic diagram with a pressure stage aperture having a layered structure;

FIG. 4: a schematic diagram of another variant of a pressure SEM according to this invention for a somewhat larger detail than in FIG. 2, in particular with a modified mounting of the upper pressure stage aperture;

FIG. 5: a schematic diagram of a somewhat larger detail than that shown in FIG. 2 for another variant of a pressure SEM according to this invention with an upper pressure stage aperture having a layered structure with additional orifices for the passage of secondary electrons;

FIG. 6: a schematic diagram of an embodiment with a purely magnetic lens;

FIG. 7: a schematic diagram of another embodiment with a purely magnetic lens;

FIG. 8: a schematic diagram of an expansion of the embodiment from FIG. 1 with an additional upper detector, and FIG. 9: a modification of the embodiment from FIG. 8 with another variant of the additional upper detector.

For an understanding of this invention, the diagrams in the figures are limited to the important components for an understanding of this invention in the area between the specimen and the detector. This does not show the other parts of a scanning electron microscope, including, for example, the housing walls, vacuum pumps, vacuum lines, the cathode, the electrodes for beam shaping, the condenser lens, the aperture, the stigmators, the alignment coils and the control devices. For example, FIG. 1 in particular shows the components essential for an understanding of this invention for an embodiment of a pressure SEM according to this invention.

The primary electron beam passes along the optical axis 79 from above through the orifice 77 in the detector 74. The deflection of the primary electron beam needed for scanning the specimen 11 is generated with the help of deflector coils 59. The primary electron beam is focused with the help of the electrostatic lens formed by electrodes 44, 50 and 55 and the magnetic field generated by the magnetic lens 62 and/or the single-pole magnetic lens 64. The electric field between electrode 44 and electrode 18 makes another contribution toward focusing the primary electron beam. It is also possible to omit the magnetic lens 62 with the pole shoe gap opened toward the optical axis or to omit the single-pole magnetic lens 64.

The electrode 55 is at a highly positive potential with respect to electrodes 44 and 50. The potential difference is preferably 1 to 15 kV and may be 7 keV, for example. Electrodes 50 and 44 are centered over the insulation 56 on pole shoe 58. Electrode 44 is at a positive potential with respect to electrode 18 with a preferred potential difference of 50 to 2000 V. Electrode 18 which is mounted over the insulation 60 is at a positive potential or at the same potential with respect to the specimen 11. The size of the applied voltage is discussed below in conjunction with FIG. 2.

Since both electrodes 18 and 44 form an electrostatic lens, it is advantageous for the resolution that the truncated conical electrode 18 can be centered on the optical axis 79 with a great accuracy during operation. A suitable possibility for this is to use micrometer screws, for example, and/or regulated piezoelectric control systems whose acting forces $F_X$ and $F_Y$ (in x and y directions) cause elastic deformation of round rods 68 which are distributed over the circumference in the example illustrated here. The electrode 44 need not be centered as accurately as electrode 18, because the equipotential surfaces of the electric field in the area of orifices 41 of electrode 44 are almost planar.

Electrodes 18 and 44 are also designed to function as pressure stage apertures at the same time. The gas flows out of the specimen chamber, through the orifice in the pressure stage aperture 18 and upward into the microscope column, which is pumped out through the corrugated tube 63 and through the orifice in electrode 55, as indicated by the arrows. The centerable pressure stage aperture 18 is sealed with respect to the outer pole shoe by sealing ring 65.

With the embodiment illustrated in FIG. 1, those parts (18, 44, 50, 56, 60, 63, 65, 68, 69), which form an unnecessary limit for the field-of-view and the working distance in operation with a vacuum in the specimen chamber, can be dismantled easily to operate the pressure SEM in vacuum operation without operating it with another electrode 50. To this end, part 69 can be unscrewed from the part above it and insulation 56 is attached to the pole shoe 58 in such a way that it is easily removed. In addition, the pressure stage aperture 18 can be replaced easily, so that pressure stage apertures with orifices of different sizes can be used, depending on the application.

An enlarged detail from FIG. 1 showing pressure stage apertures 18 and 44 and the specimen 11 is diagramed in FIG. 2. Electrode 44 is at a positive potential with respect to electrode 18, the size of the potential being selected so that approximately the same electric field strength prevails directly above and below the orifice 41. This achieves the result that the curvature of the equipotential surfaces in the area of orifice 41 is as weak as possible. In addition, the upper pressure stage aperture 44 is very thin to induce the lowest possible curvature of the equipotential surfaces near the optical axis. Its preferred thickness near the optical axis is less than 300 $\mu$m and greater than 0.4 $\mu$m (e.g., 20 $\mu$m). It can either be made of metal (e.g., as a thin-layer aperture which can also be heated with the primary electron beam if needed) or it can be produced by etching a semiconductor material in particular (e.g., silicon). In the last case, either a thin layer of the semiconductor is left in etching, or only one layer of metal which was previously applied to the semiconductor is left over.

The preferred size of the orifices 16 and 41 of the pressure stage apertures in FIG. 2 depends on the desired maximum allowed pressure in the specimen chamber, the desired smallest usable primary energy, the voltage and the distance between the electrodes 18 and 44 and the quality of the vacuum needed by the cathode (e.g., a Schottky emitter). The diameter of the orifice 16 of the pressure stage aperture 18 may be, for example, 20 $\mu$m to 500 $\mu$m. However, the size of orifice 16 may also be 1000 $\mu$m if the requirement of suitability for low primary energy is waived or if the pressure in the specimen chamber is limited to a low pressure level. For example, the preferred diameter of the orifice 41 may be 100 μm to 2000 μm, for example. It is preferably at least twice as great as the diameter of orifice 16.

When using semiconductor material for the pressure stage aperture 18, it may also be designed as a semiconductor detector for backscatter electrons. One possibility for this is for the lower side 14 and the lower area of the outside 15 of the pressure stage aperture to have n-type doping and be coated with a thin layer of sputtered metal, so that a Schottky contact is formed.

The primary electron beam enters the specimen chamber from above through orifice 16 in FIG. 2, crosses through the gas in the specimen chamber and strikes specimen 11, where it generates secondary electrons and backscatter electrons. The secondary electrons have a large effective cross section for elastic scattering. Its axis of motion is therefore often inverted, as in a diffusion process, and there is the risk that the scattering might be absorbed before reaching the specimen. Therefore, the secondary electrons are deflected toward the orifice 16 with the help of an electric field which consists either only of the field passage through orifice 16 or by additional application of a voltage between the specimen 11 and the pressure stage aperture 18.

There is an optimum voltage between the specimen 11 and the pressure stage aperture 18 at which the most secondary electrons reach the detector 74, depending on the gas and the pressure in the specimen chamber, the diameter of the orifice 16, the length of the bore wall 17, the cone angles β and γ of the inner conical face 22 and the distance between the specimen 11 and the pressure stage aperture 18. This voltage may be between zero and a few hundred volts. For small distances between the specimen 11 and the pressure stage aperture 18, the field passage through the orifice 16 of the pressure stage aperture may be sufficiently great (depending on the parameters mentioned above) to deflect the secondary electrons toward the orifice 16. Then the specimen 11 and the pressure stage aperture 18 may be at the same potential.

Applying a voltage between the specimen 11 and the pressure stage aperture 18 has several effects. It generates a stronger electric field and thus improves the transport of the secondary electrons upward to the pressure stage aperture 18. At the same time, it reduces the curvature of the equipotential surfaces downward and directly below the orifice 16, so that the secondary electrons are less deflected toward the optical axis 79 in this area.

For a bore length of orifice 16 which is not too great and for small distances between the specimen 11 and the pressure stage aperture 18 (for distances up to twice the diameter of the orifice 16, for example, depending on the pressure in the specimen chamber and the geometry of the pressure stage aperture 18), a large portion of secondary electrons also pass through orifice 16 even when the voltage between the specimen 11 and the pressure stage aperture 18 is selected to be so large that the field strength is approximately the same close below the orifice 16 as it is inside the orifice 16. In this way, the distortion at the edge of the field-of-view decreases so that the field-of-view can be increased. This is true in particular of both applications of pressure stage apertures 18 whose inner conical surface 22 has a large cone flare angle β and where the length of the bore wall 17 is small in relation to the diameter 16 of the orifice. Another possibility of increasing the field-of-view is that the distortion occurring at the edge of the field-of-view is corrected subsequently with the help of an image processing program.

For greater distances (e.g., 1000 μm) and higher voltages (e.g., 200 V) between specimen 11 and the pressure stage aperture 18, a secondary electron cascade is obtained as additional pre-amplification. When using a sufficiently large pressure stage aperture orifice 16 (>200 μm, e.g., 250 μm), enough secondary electrons enter the orifice 16 to obtain a good detection efficiency at even greater distances.

Within the orifice 16 of the pressure stage aperture, the electric field is also responsible for continued transport of the secondary electrons upward. The electric field pattern is more favorable in this regard, the smaller the length of the bore 16 in comparison with its diameter. To this extent, a pressure stage aperture 18 like that illustrated in FIG. 5 is preferred; it does not have a cylindrical bore wall 17 at all, but instead has only a sharp inside edge as the border between the bottom side 14 and the top side 22 of the pressure stage aperture.

In addition to the electric fields between the specimen 11 and the pressure stage aperture 18 and within the orifice 16, the magnetic field generated by the single pole lens 64 illustrated in FIG. 1 is also very helpful for transport of the secondary electrons toward the orifice 16 and through the orifice 16. The component of movement of the secondary electrons perpendicular to the optical axis 79 is deflected by the magnetic field onto a circular path with the help of the Lorentz force. This achieves the result that a secondary electron emitted by the specimen can increase its distance from the optical axis 79 between two collisions by a maximum of twice its Larmor radius on its path upward. The low-energy secondary electrons whose effective cross section for elastic scattering is especially large have a particularly small Larmor radius which is an advantage. In particular for the secondary electrons with an energy of more than 10 eV, another advantage is that there is a much greater probability of a smaller angle of diffusion than a large angle of diffusion. As a result, the distance between the mid points of the circle of motion before collision and after collision is much smaller than the sum of the two Larmor radii. Since the secondary electrons can be a much shorter distance away from the optical axis 79, more secondary electrons pass through the orifice 16 of the pressure stage aperture when using a single-pole lens than without the single-pole lens.

For transport of the secondary electron through the intermediate spaces between the pressure stage apertures 18 and 44 and through the orifice 41 of the upper pressure stage aperture, the magnetic field of the single-pole lens 64 also plays an important role, if it is present. The pressure stage apertures are arranged so that the magnetic field lines passing through the orifice of the lower pressure stage aperture 18 and also through the orifice 41 of the upper pressure stage aperture. (This is the case, for example, when the orifice of the upper pressure stage aperture 44 is smaller than the orifice of the lower pressure stage aperture 18 and the upper pressure stage aperture 44 is mounted beneath the pole shoe 58, as illustrated in FIGS. 1, 6, 7, 8, 9 and 10.) Since there is no great scattering above the lower pressure stage aperture, the result is that all the secondary electrons which pass through the lower pressure stage aperture also reach the upper pressure stage aperture unless they are forced to reverse their direction due to the increasing magnetic field strength. The latter applies only to the secondary electrons with large angles with respect to the optical axis. This can be avoided completely by applying an additional voltage between the electrodes 18 and 44.

Above the orifice 16 of the lower pressure stage aperture 18 in FIG. 2, the pressure up to orifice 41 of the upper pressure stage aperture 44 drops by several powers of ten in comparison with the pressure in the specimen chamber. The drop in pressure depends on the size of the orifice 16 of the lower pressure stage aperture. This drop in pressure toward the upper area causes an increase in the mean free path length of the secondary electrons.

At a low pressure (e.g., 1 hPa) in the specimen chamber or at a small diameter (e.g., 200 µm) of the lower pressure stage aperture 16 or when the secondary electrons have a relatively high energy level(e.g., 20 eV) on reaching the orifice 16, no additional electric field is necessary above the pressure stage aperture 18 to deflect the secondary electron through the upper pressure stage aperture 41 when the magnetic field of the single-pole lens 64 is present to deflect the secondary electrons through the upper pressure stage aperture 41.

If the single-pole lens 64 is not present or is not activated strongly enough, the secondary electrons in the embodiments in FIGS. 2 through 4 are focused on the upper pressure stage aperture 41 by the electric field between the two pressure stage apertures, with a good vacuum prevailing above this aperture where the secondary electrons are detected. With this function principle, it is necessary for the secondary electrons not to execute any more collisions when they are focused on the orifice 41 of the upper pressure stage aperture. This is achieved due to the reduction in pressure and the increase in the electric field strength above the orifice of the lower pressure stage aperture 18. Simultaneously with the increase in the mean free path length of the secondary electrons, the electric field strength above the orifice 16 also increases greatly toward the top due to the conical shape of the electrode 18. Both of these factors together have the result that the velocity reached by the secondary electrons between two collisions increases greatly above the orifice 16. In addition, the mean free path length of the secondary electron also increases with an increase in velocity, so the secondary electrons become so fast above the orifice 16 within their free path length (and thus their mean free path length also increases greatly) that the secondary electrons no longer have any collisions.

Many secondary electrons thus have their last collision at a slight distance above the orifice 16. They are then focused on orifice 41 of the upper pressure stage aperture by the electric field between the two electrodes 18 and 44. If the single-pole lens 64 is in operation, any desired cone flare angles β≦90° are possible. If the single-pole lens 64 is not in operation, the cone flare angle β for the inner conical face 22 is preferably between 20° and 75°. Even under the secondary condition that the electric field strength in the orifice 41 and directly beneath the orifice 41 should be equivalent, it is possible to focus the secondary electrons on the orifice 41 with no problem. Even at a preselected potential difference between electrodes 44 and 55 and preselected cone flare angles β and γ, focusing of the secondary electrons on the orifice 41 is achieved by selecting a suitable position of the electrode 44. If electrode 50 is somewhat longer, and thus the electrode 44 is arranged at a somewhat lower level (with a smaller outside diameter accordingly), then a low electric field strength is obtained in orifice 41. Accordingly, the potential difference between electrodes 18 and 44 is reduced to such an extent that the same field strength prevails again directly beneath orifice 41 as in side the orifice 41. This yields a weaker focusing of the secondary electrons while at the same time the path length along which the secondary electrons are focused is shortened. (Because of the lower potential difference between electrodes 18 and 50, this distance can be shortened further by reducing the distance between the two electrodes.)

Thus, even without the magnetic field of the single-pole lens 64, it is always possible to achieve the result that the secondary electrons are focused on the orifice 41 through the electric field by arranging the electrode 44 at a suitable height. (This is impossible only at very large cone flare angles β.) Another possibility of increasing the field strength in the orifice 41 and accordingly increasing the focusing of the secondary electrons consists of installing electrode 44 in FIG. 2 with the flat face upward in the orifice of the electrode 50.

If the diameter of the orifice 41 is selected to be so small that the slightly different focusing of the secondary electrons is manifested in operation without a sufficient magnetic field of the single-pole lens 64 at a different gas pressure in the specimen chamber, then a preferred embodiment of the present invention consists of the fact that the focusing of the secondary electrons on the orifice 41 can be adjusted. (This does not require any great change in focus.) Focusing of the secondary electrons on the orifice 41 is achieved, for example, when the voltage between the electrodes 18 and 44 can be altered and then also the voltage between electrodes 44 and 55 can be altered in proportion to the former. Another possibility is that one of the pressure stage apertures 18 or 44 is adjustable in height (i.e., its position along the optical axis is adjustable). Another possibility of altering the focusing is obtained by using an additional electrode that does not function as a pressure stage aperture, has a larger orifice diameter which is mounted between electrodes 18 and 44 and is preferably attached to one of these two electrodes over the insulation and centered there. The potentials of electrode 18 and the additional electrode can then be altered so that the equipotential surfaces in the orifice 41 continue to remain planar while the focusing of the secondary electron is altered. The adjustable or variable focusing of the electrons mentioned here is important for large pressure stage aperture orifices 16 in particular.

The remaining path of the secondary electron above the electrode 44 is explained in greater detail below on the basis of FIG. 1. The secondary electrons are further accelerated by the electric field between the electrodes 44 and 55 and fly with a high kinetic energy to the detector 74. Due to the great reduction in gas pressure within and above the pressure stage apertures 18 and 44, a sufficiently good vacuum for using detectors with a high detection sensitivity is achieved despite the increased pressure in the specimen chamber at the location of the detector 74. In particular, scintillator-wave guide combinations, channel plates and semiconductor detectors with a metal-semiconductor transition or with a p-n junction are very suitable for use as detector 74. Scintillator-photomultiplier combinations based on plastic scintillators, YAG scintillators, YAP scintillators and the like may also be used. When using a channel plate, it is advisable to use an additional liner electrode for the opening of the detector, as described in German Patent application DE 3,703,029 A1.

FIG. 3 shows a different variant of a pressure SEM according to the present invention for the same detail as in FIG. 2 to illustrate the second factor mentioned above. The upper pressure stage aperture in FIG. 3 is designed in layers. Its bottom side 39 and top side 43 are made of conductive materials, while at least one layer of an insulating material is provided in the interior. Contacting of the conductive layers 39 and 43 thus takes place outside the range illustrated here.

The potentials of electrodes 18, 39 and 43 were selected so that the same electric field strength would prevail in the orifices of electrodes 39 and 43 and in area 41 between the orifices of the two electrodes. Since the preferred thickness of the electrodes 39 and 43 is very small (≦100 μm) near the optical axis 79, the equipotential surfaces in the area of the orifices of the electrodes 39 and 43 and in area 41 between them are almost planar. The preferred distance between electrodes 39 and 43 is 10 to 1000 μm. A suitable possibility of producing such a pressure stage aperture 18 produced in layers with very thin electrodes 39 and 43 consists, for example, of electrodes 39 and 43 being metal coatings on an insulator between which the insulator has been etched away in an area around the optical axis. The orifice of the electrode 39 may also be equal to or larger than the orifice of electrode 43 and more than two conductive layers may also be used. In addition, the lower pressure stage aperture 18 may also be designed in layers. The conductive layers may be in particular planar, conical or in the form of a truncated cone. Using a lower pressure stage aperture 18 composed of layers offers in particular the advantages that transport of secondary electrons to the detector is improved, the field-of-view can be increased and the error coefficient of the electrostatic lens adjacent to the pressure stage aperture 18 can be reduced.

FIG. 4 shows a detail with the pressure stage apertures for another variant of a pressure SEM according to the present invention. The difference in comparison with the variant from FIG. 2 consists of the additional mounting 40 for the pressure stage aperture 44 and the fact that the electrode 50 in FIG. 4 is designed as a direct continuation of pole shoe 58 without the insulation 56 in between, so that it is especially well centered with respect to the optical axis and is grounded. In this variant, the electrode 50 cannot be dismantled, while parts 13, 18, 40, 42 and 44 (and 60, 63, 65, 68 and 69 from FIG. 1) can be removed for operation of the pressure SEM with vacuum in the specimen chamber. Apart from the additional single-pole lens, the SEM remaining for vacuum operation after removal corresponds largely to the traditional designs of SEMs, like those available from companies such as ICT and LEO.

Mount 40 which is designed as a spring element holds the pressure stage aperture 44, which is centered on the bore of electrode 50, in its position. It would also be possible to use a spring element as the mount which is supported over insulation on the part 18 beneath it. Furthermore, the pressure stage aperture 18 could also be centered on the suitably redesigned outer edge of the electrode 50. It is also possible to omit the upper pressure stage aperture 44, its mount 40 and the additional pumping out through corrugated tube 63 (see FIG. 1). This has the advantage of a simplified design with simplified assembly, where focusing of the secondary electrons is not necessary even without the single-pole lens 64, and no negative influence of an upper pressure stage aperture 44 on focusing of the primary electron beam is possible. With this variant without an upper pressure stage aperture 44, however, only much lower pressures can be used in the specimen chamber at the same orifice diameter of the remaining pressure stage aperture 18. This variant with just one pressure stage aperture 18 beneath the detector 74 is therefore less suitable for observation of wet specimens with a large field-of-view, but instead is used mainly for applications where the gas in the specimen chamber is used to combat a charge buildup.

When the single-pole lens 64 is not in operation, a first secondary electron crossover is obtained in vacuum operation with the designs illustrated in FIGS. 2 through 4 just above the orifice 16 and is imaged by the electric field between the electrodes 18 and 44 (or 39) on the orifice 41. Focusing of the secondary electrons on the orifice 41 is achieved by applying a low voltage between the specimen 11 and electrode 18 and/or by one of the measures described in conjunction with FIG. 2 to alter the focusing of the secondary electrons. For vacuum operation with the pressure SEMs illustrated in details in FIGS. 2 through 4, the combination with an additional upper detector 91 from FIG. 8 or 9 is advantageous.

When the single-pole lens 64 is not in operation, the secondary electron must be focused on the orifice 41 of the upper pressure stage aperture in the embodiments from FIGS. 2 through 4. FIG. 5, however, illustrates an embodiment where the secondary electrons need not be focused on a certain location even without the magnetic field of the single-pole lens and accordingly, the deciding parameters for secondary electron focusing can be selected freely. Another advantage of the embodiment illustrated in FIG. 5 is that even without the magnetic field of the single-pole lens 64 a very large component of the secondary electrons contributes to the signal of the detector.

The path of the primary electron beam through orifices 41 and 16 to the specimen 11, the voltage between the specimen 11 and the pressure stage aperture 18, the path of the secondary electron from the specimen 11 to the orifice 16 and through orifice 16 and the pressure reduction above the orifice 16 are the same as in FIG. 2. Instead of the very thin-walled pressure stage aperture 44 in FIG. 2, however, FIG. 5 shows the thick-walled part 42. Its preferred thickness (length of the passage 41) is 0.4 mm to 6 mm. It is constructed in layers of insulating and conductive layers running perpendicular to the optical axis 79 and indicated in FIG. 5 by the horizontal hatching of part 42. The conductive layers have a preferred thickness of less than 200 μm, while the insulating layers may also be thicker. Part 42 is fitted into the insulating mount 40 which centers part 42 on the bore in electrode 50. The top side of part 42 is covered by the conductive layer 39, which forms an electrode that is at the same potential as electrode 50. The lower sides of part 42 and mount 40 are covered by the conductive layer 39. It forms an electrode which is at a negative potential with respect to electrode 43. Part 42 has a central passage 41 around the optical axis 79 and also has several passages 36 distributed around the circumference.

The surface of passages 36 and 41 is covered with a layer that is a poor conductor and whose electric parameters correspond to those of a layer which is a poor conductor, for example, such as those used in a channeltron or a channel plate. The layer which is a poor conductor in passages 36 and 41 has a total resistance which is uniformly distributed along the optical axis. (To achieve a uniform distribution of the resistance along the optical axis, an additional poor conductor layer may be applied to part 42 at the interface with part 40.) This results in a homogeneous electric field in passages 36 and 41 between electrodes 39 and 43 with which the poor conductor layer is in contact. The layered structure of part 42 of alternately thin insulating layers and thin conducting layers yields a rotationally symmetrical electric field even with a slightly non-homogeneous distribution of the poor conductor layer in passage 41, so a good resolution is achieved.

The size of the voltage between electrodes 50 and 55 has been discussed in conjunction with FIG. 1. The voltage between electrodes 39 and 43 is so high that the electric field strength within the passage 41 is the same as that directly above passage 41. The voltage between electrodes 25 and 39 is so high that the electric field strength directly beneath passage 41 is the same as that inside passage 41. The pressure stage aperture 18 is at the same potential as electrode 25 and it is mounted on electrode 25 in such a manner that it is easily dismantled. A preferred embodiment of the design from FIG. 5 consists of the fact that the pressure stage aperture 18 can be changed without venting the specimen chamber. A corresponding device for changing the pressure stage aperture 18 (not shown) may be mounted on the edge of the specimen table, for example.

The elongated narrow passages 36 and 41 represent a great flow resistance for the gas which is beneath part 42. This flow resistance is more than one order of magnitude greater than the flow resistance in pumping through the electrode 55 illustrated in FIG. 1. The preferred diameter of the passages 36 is smaller than the preferred diameter of the passage 41. The passages 36 may widen toward the bottom, as illustrated in FIG. 5, so that only narrow webs remain between the passages 36 on the bottom side of the part 42. This increases the amount of secondary electrons passing through passages 36.

The secondary electrons in FIG. 5 enter passage 41 and/or passages 36 (depending on the focusing of the secondary electrons). When a secondary electron strikes the poor conductor layer at the surface of a passage, it produces at least one secondary electron there with a high probability (as in a channeltron or a channel plate) and therefore makes a contribution to the signal of the detector.

It is also possible to operate in vacuo or at a very low pressure in the specimen chamber with the design illustrated in FIG. 5. When the lower pressure stage aperture 18 is removed, a good resolution and a good detection efficiency are achieved even with a great distance (>5 mm) between specimen 11 and electrode 25. The voltage between electrodes 25 and 39 is so great that the electric field strength directly beneath passage 41 is the same as that inside passage 41. A very large field-of-view is obtained when using a double deflecting element when the scanning center is just above or inside passage 41.

An especially advantageous and preferred embodiment of the design illustrated in FIG. 5 consists of the fact that part 42 is arranged very close to the lower pressure stage aperture 18 (with a preferred distance of less than 2 mm to the pressure stage aperture 18). Passages 36 are omitted here, and passage 41, part 42, insulation 40 and conductive layer 39 have a conical taper toward the lower end. If the magnification is not too small ($\geq$approx. 1000×), this variant yields a very good detection efficiency in combination with single-pole lens 64. For small magnifications, single-pole lens 64 is turned off.

The embodiments from FIGS. 1, 3 and 5 are provided with a combined electrostatic and magnetic lens. The embodiments illustrated in FIGS. 2 and 4 are functional in combination with a combined electrostatic and magnetic lens as well as with a strictly magnetic lens which generates a magnetic field between the pressure stage apertures (e.g., a single-pole lens). In the case of a purely magnetic lens, the voltage between the pressure stage apertures 18 and 44 may be lower than with a combined electrostatic and magnetic lens, or both pressure stage apertures may even be at the same potential. Due to the lower electric field strength in the area of the upper pressure stage aperture 44, there is no need for an especially thin pressure stage aperture 18, but instead a conventional aperture, for example, may also be used as the pressure stage aperture.

FIGS. 6 and 7 show embodiments with a purely magnetic lens. FIG. 6 shows a detail of a lens like that known from European Patent EP 0767482 (FIG. 1). This lens can be operated with lens 62 with an axial pole shoe gap or with the single-pole lens located outside the region illustrated in FIG. 6, its inner pole shoe 58 extending up to close to the specimen. In operation with the single-pole lens, detection takes place in the area between the pole shoe 58 and the lens 62 in FIG. 2, this area being shielded with respect to the magnetic fields of the two lenses. The signal is relayed with the help of an optical fiber through a bore in the pole shoe 58 and is amplified by a photomultiplier outside the area illustrated. If the single-pole lens is not in operation, operation with gas in the specimen chamber is possible with the design shown in FIG. 6 only for working distances of more than approximately one millimeter with a collector electrode or a gas scintillation detector. In FIG. 6, detection is performed in this case with the help of collector electrode 13 and preferably a double deflector element is used with which it is possible to scan around a point between the two pressure stage apertures.

The electric field strength above the pressure stage aperture 18 can be selected freely in a wide range with the design according to FIGS. 6 and 7. It may be much smaller than that with the design according to FIGS. 2 through 5 with the combined electrostatic and magnetic lens, and it can even disappear completely, as is the case in FIG. 6, where the two pressure stage apertures 18 and 44 are at the same potential. This has the advantage that the two pressure stage apertures can be combined with the help of conductive part 19 in a very simple design to form one assembly unit 26 which is mounted on part 25 in such a way that it can be removed easily (as in FIG. 5).

In FIG. 6, no electrode which is at a positive potential by comparison is provided above the lower pressure stage aperture 18. An even better detection efficiency is obtained in comparison with FIG. 6, however, with a modification of the embodiment illustrated in FIG. 6, where the upper pressure stage aperture 44 is at a positive potential with respect to the lower pressure stage aperture 18. The upper pressure stage aperture can be contacted advantageously over the pole shoe 58 or over the electrode 67, and part 19 has a smaller height and a larger outside diameter and it also includes insulation.

The primary electron beam in FIG. 6 runs near the optical axis 79 and is focused on the specimen 11 by the magnetic field of the lens 62 with an axial pole shoe gap and/or by the magnetic field of the single-pole lens. In FIG. 6, the path of the primary electron beam through the orifice of the pressure stage aperture 18 to the specimen 11, the voltage between the specimen 11 and the pressure stage aperture 18 and the movement of the secondary electrons from the specimen 11 to the orifice of the pressure stage aperture 18 are the same as those in FIG. 2 when using the single-pole lens 64. The difference is that in FIG. 6 there is no electric field above the pressure stage aperture 18 and thus there is no field feedthrough downward through the orifice in the pressure stage aperture 18, so that the specimen 11 and the pressure stage aperture 18 must not be at the same potential, but instead the pressure stage aperture should be at a positive potential with respect to the specimen.

Depending on the gas pressure, the diameter of the orifice of pressure stage aperture 18, the distance between the specimen and the pressure stage aperture, tilting of the specimen, the primary energy and magnification, the preferred voltage between the specimen and the pressure stage aperture in FIG. 6 is a few volts to a few hundred volts in operation with an excited single-pole lens. For example, a voltage of a few volts is sufficient for transporting the secondary electrons to the lower pressure stage aperture orifice when working with water vapor at a gas pressure of 10 mbar, for example, a magnetic flux density of 200 mT, for example, at the location of the specimen and a pressure stage aperture orifice diameter of 250 µm, for example, and a distance between the specimen and the pressure stage aperture of 250 µm. For the modification of the embodiment illustrated in FIG. 6 as discussed above, where the upper pressure stage aperture 44 is at a positive potential with respect to the lower pressure stage aperture 18, effective further transport of the secondary electrons above the lower pressure stage aperture 18 also takes place here even at this low voltage between the specimen and the pressure stage aperture. For the embodiment illustrated in FIG. 6, without an electric field in the area within and above the lower pressure stage aperture orifice, the secondary electrons arriving there with an energy of a few electron volts, however, have only a weak, forward-directed angular distribution of their direction of motion and execute elastic collisions with relatively large average scattering angles. However, a lower probability of scattering, a smaller average scattering angle and a stronger forward-directed angular distribution of the direction of motion are obtained when a voltage of 20 volts is applied, for example. Much higher voltages up to several hundred volts may also be advantageous because a weak secondary electron cascade would then develop under the conditions of the above example. Although the gain would be completely inadequate in conjunction with a collector electrode or a gas scintillation detector, an additional gain is achieved in conjunction with the high-sensitivity detector 51 and can completely compensate for the slightly reduced amount of secondary electrons reaching detector 51 due to the broader energy distribution, depending on the design of the detector.

The gas entering through orifice 16 from the specimen chamber is pumped out through the side orifices 20 and the tube 31. As in FIG. 2, there is also a great drop in pressure above orifice 16 in FIG. 6 and an increase in the mean free path length of the secondary electron, so that many secondary electrons have their last collision at a small distance above the orifice 16. In operation with an excited single-pole lens, the secondary electrons are forced onto spiral paths where they pass through the upper pressure stage aperture 41.

The preferred size of the orifices in the pressure stage apertures 18 and 44 depends on the desired maximum allowed pressure in the specimen chamber, the desired smallest primary energy that can be used and on the quality of the vacuum required by the cathode. It is possible to insert additional pressure stage apertures above the pressure stage aperture 44 and evacuate the resulting intermediate spaces. The preferred diameters of the orifices of the pressure stage apertures 18 and 44 are the same as in FIG. 2, where the orifice may also be smaller than the orifice of the lower pressure stage aperture 18, however, because the magnetic flux density created by the single-pole lens is much greater in the upper pressure stage aperture orifice 41 (and the Larmor radius of the secondary electrons is much smaller) than in the orifice of the lower pressure stage aperture 18. Therefore, even with a smaller upper pressure stage aperture, it is possible to achieve the result that all the magnetic field lines passing through the orifice of the lower pressure stage aperture also pass through the upper pressure stage aperture and accordingly almost all the secondary electrons whose velocity component in the direction of the optical axis is large enough will also pass through the upper pressure stage aperture, so they are not forced to reverse directions by the increasing magnetic flux density. With the modification of FIG. 6 discussed here, where the upper pressure stage aperture 44 is at a positive potential with respect to the lower pressure stage aperture 18, almost all the secondary electrons that pass through the lower pressure stage aperture will also pass through the upper pressure stage aperture.

With the design illustrated here, not only operation with gas in the specimen chamber but also operation with a vacuum in the specimen chamber is possible with an excited single-pole lens, where the secondary electrons travel on spiral paths through the pressure stage apertures.

To illustrate the qualitative course of the magnetic fields, FIG. 6 shows two magnetic field lines from the specimen to the interior of the detector housing 72 as an example. The magnetic field strength decreases greatly above the pressure stage aperture orifice 41. The strong magnetic field of the single-pole lens is released by the much weaker magnetic field of the cylindrical coils 66 and 71, guiding the secondary electrons farther upward. The axis of symmetry of these magnetic fields coincides with the optical axis. Above the cylindrical coil 71 there is a counter-electrode 78 which can be put at a negative potential with respect to the detector housing 72 and with which the secondary electrons can be decelerated in the direction of the optical axis, depending on the applied voltage between the specimen 11 and the pressure stage aperture 18, and diverted in the direction of the wire network 75. In addition, the secondary electrons are deflected above the cylindrical coil 71 by the magnetic field 80 generated by coil 71 to the wire network 75. The secondary electrons pass through the wire network 75 into the detector housing 72. On the other side of the wire network, a strong electric field prevails, accelerating the secondary electrons to the detector 51 where they are detected.

The preferred voltage between the wire network 75 and the detector 51 is 1 to 10 kV. Detector 51 may be, for example, a semiconductor detector or a scintillator, as illustrated in FIG. 6. The use of such a high-sensitivity secondary electron detector whose high voltage would lead unavoidably to spark-overs when there is a gas pressure in the specimen chamber is the reason for the much better signal-to-noise ratio which is obtained with gas in the specimen chamber in the embodiment illustrated in FIG. 6 in comparison with the scanning electron microscopes known in the past.

The space above the pressure stage aperture 44 is pumped out through the intermediate space between the cylindrical coils, which may also be divided into more than two parts, and then through the additional bores 38, which are provided anyway for electronoptical reasons. The tube 32 through which the space is pumped out opens into a part which is sealed with respect to the pole shoe by gasket 33.

A great structural simplification in FIG. 6 can be achieved by omitting part 25, tube 31, the lower pressure stage aperture 18 and part 19, which then becomes superfluous. Then, however, only operation with a much smaller pressure stage aperture orifice 41 is possible at the same pressure in the specimen chamber.

To perform energy-dispersive X-ray spectroscopy (EDX) with the embodiments from FIG. 6 (or its modification mentioned above with an additional voltage between the two pressure stage apertures) and FIG. 7, an EDX detector is mounted in the specimen chamber outside the area illustrated in the direction of the arrow labeled as "EDX"; this is also possible in FIG. 1. In FIG. 6, an attachment 26 without the collector electrode 13 is preferably used to permit EDX detection at a small distance between the pressure stage aperture 18 and the specimen 11.

For EDX detection, the distance between the pressure stage aperture 18 and the specimen 11 is preferably greater than the diameter of the orifice of the pressure stage aperture 18 and is less than 1.5 millimeters. A voltage of 50 volts up to several hundred volts, e.g., 300 V, is preferably applied between the pressure stage aperture and the specimen. The gas pressure in the specimen chamber is set so high that any charge build up due to the gas ions generated by the accelerated secondary electrons would be compensated. Use of a small distance between the specimen and the pressure stage aperture and a higher gas pressure accordingly has the advantage that the gas ions reach the specimen in a much more controlled manner at the location where the charge is generated. It thus increases the efficiency in combatting a charge buildup by the gas ions since a larger percentage of gas ions reach the specimen in the small range in question. This makes it possible to reduce the product p·d (pressure times path length of the primary electrons through the gas) and accordingly to work with a reduced primary electron scattering. In addition, the scattered primary electrons strike the specimen at a smaller distance from the spot on the specimen being analyzed at the moment. When the single-pole lens is in operation, secondary electron images of the specimen can also be recorded with the high-sensitivity detector 51 simultaneously with recording EDX spectra. In contrast with the detectors known today for working at a high pressure in the specimen chamber, this detector is especially advantageous for the short distance between the specimen and the pressure stage orifice which is advantageous in EDX. Due to the reduced primary electron scattering and the reduced signal from the surrounding specimen sites associated with this, the detection sensitivity in EDX spectra is greatly improved. Optionally the primary energy may also be reduced and thus the resolution for the EDX spectra can be improved. Thus, the greatest disadvantages of EDX spectra today with gas in the specimen chamber are reduced.

The advantage of a lower primary electron scattering because of more effectively combatting a charge buildup at a reduced distance between the specimen and the pressure stage orifice, as is possible through the embodiments in FIGS. 1 through 9, is obtained not only for EDX, but instead for all applications in conjunction with combatting a charge buildup.

For the application of combatting a charge buildup on a planar specimen which must not be tilted over, which occurs with metrology equipment in semiconductor production, a modification of the embodiments illustrated in FIGS. 1 through 3 represents a preferred embodiment. In this embodiment, both pressure stage apertures 18 and 44 are planar, and a homogeneous electric field is applied between the pressure stage apertures as well as between the lower pressure stage aperture 18 and the specimen 11. In addition, the inner pole shoe 58 of the single-pole lens 64 in this embodiment, where lens 62 can be omitted, is pulled far downward so that the electric field between the electrode 55 and the pole shoe 58 forms the electrostatic lens. In addition to its simple production, the advantage of this embodiment is in particular the comparatively low demands made regarding centering of the two pressure stage apertures, so no device is necessary for centering the lower pressure stage aperture 18.

The same advantage of unproblematical centering is also obtained for another modification of the embodiment illustrated in FIGS. 1 and 2, which is provided not only for combatting a charge buildup and where the lower pressure stage aperture 18 has the conical shape illustrated in FIGS. 1 and 2, so that tilting of the specimen is also possible. A single-pole lens 64 is also used in this preferred embodiment, its inner pole shoe 58 being drawn downward to a great extent so that together with the electrode 55 it forms the electrostatic lens. In this embodiment, however, the planar upper pressure stage aperture 44 is at a positive potential with respect to the grounded pole shoe 58. This yields a low field strength within the upper pressure stage aperture orifice 41, so that only a low voltage is necessary between the two pressure stage apertures 18 and 41 to obtain planar equipotential surfaces in the upper pressure stage aperture orifice 41. Because of the low field strength between the two pressure stage apertures, centering of the lower pressure stage aperture 18 is also unproblematical in this embodiment, so that no special device is necessary for this.

As in FIGS. 6 and 7, the upper pressure stage aperture 44 is also arranged just beneath the lower edge of the pole shoe 58 in these two embodiments, e.g., at the level where the maximum magnetic flux density prevails on the optical axis.

FIG. 7 shows another embodiment of the pressure SEM according to this invention with a strictly magnetic lens, which consists only of a single-pole lens 64 in this case. The path of the primary electrons to the specimen, focusing of the primary electron beam through single-pole lens 64, the preferred size of the orifices of the pressure stage apertures 18 and 44 and the preferred voltage between the specimen 11 and the lower pressure stage aperture 18 are the same as in FIG. 6. For the voltage between the specimen and the lower pressure stage aperture, however, it should be pointed out that FIG. 7 corresponds to the modification of FIG. 6, where the upper pressure stage aperture 44 is at a positive potential with respect to the lower pressure stage aperture 18. With the embodiment illustrated in FIG. 7, a low voltage of a few volts between the probe and the lower pressure stage aperture has the advantage that the secondary electrons have only a small velocity component perpendicular to the optical axis. This improves the detection efficiency in subsequent detection. In addition, the secondary electrons, which have an energy of only a few electron volts, also have a very small Larmor radius, but they have a larger mean scattering angle than they would at a higher energy. Whether the positive or negative effect is predominant depends on the distance between the specimen and the pressure stage orifice, the gas pressure, the primary energy and the diameter of the pressure stage orifice aperture 16.

In FIG. 7, both pressure stage apertures could also be set at the same potential. This would have the advantage that they could be designed very easily as common insert, but it would have the disadvantage of a reduced detection efficiency in comparison with the design presented here. The preferred potential difference between the two pressure stage apertures 18 and 44 in FIG. 7 is between 5 V and 500 V. Depending on the excitation of the single-pole lens, the magnetic field lines and the voltage between the specimen 11 and the lower pressure stage aperture 18 there is a voltage limit for the voltage between the two pressure stage apertures 18 and 44 beyond which no more secondary electrons are forced to reverse their directions due to the increasing magnetic flux density directed upward, but instead almost all the secondary electrons passing through the lower pressure stage aperture orifice 16 will also pass through the upper pressure stage aperture orifice 41. In addition to this voltage limit, however, the energy supplied to the secondary electrons is an important factor in the choice of the voltage between the pressure stage apertures. The voltage between the upper and lower pressure stage apertures is set so high that the energy of the secondary electrons above the upper pressure stage aperture 44 is at least as great as the minimum energy required to avoid following the magnetic field lines which diverge there but instead to continue to move upward in the direction of the detector. The secondary electrons can then be decelerated again by the counter-electrode 78 which is at the average potential of the two electrodes 75 and 81.

Detector 51 with its strong suction field is behind the grid electrode 75. The secondary electrons are deflected toward the grid electrode 75 by the electric field between electrodes 75 and 81 and by the magnetic field 80. For the primary electrons with their opposite direction of travel, the forces acting due to the magnetic field and the electric field cancel one another out, however, and the two fields form a Wien filter. In order not to generate any chromatic errors even with a primary energy of less than 4 keV with a relatively strong excitation of this Wien filter—e.g., for deflection of 20 eV secondary electron, a second Wien filter rotated by 180° is arranged above the first Wien filter, compensating for the effect of the lower Wien filter for the primary electrons. This additional upper filter need not be arranged directly above the lower Wien filter, but instead it may also be further up in the column. Its static magnetic field may also be generated by a scanning coil.

The greater excitation of the Wien filter, which deflects the secondary electrons to the detector, in comparison with vacuum operation, is advantageous when a greater voltage is applied between the specimen and the lower pressure stage aperture because it then increases the detection efficiency. Such a higher voltage up to a voltage of several hundred volts may be advantageous, depending on the operating conditions. In particular when there is a great distance between the specimen and the lower pressure stage orifice, a secondary electron cascade may be generated by a voltage of 100 V to 500 V, for example, leading to the fact that a very good detection efficiency is obtained even when only a small portion of the secondary electrons pass through the lower pressure stage aperture orifice 16. Thus, the design illustrated in FIG. 7 is also suitable for large working distances. The same thing is also true of the embodiment from FIG. 6 and for a modification of this embodiment with a voltage between the two pressure stage apertures.

A typical energy value for the maximum secondary electron energy distribution at a voltage of 400 V between the specimen and the lower pressure stage aperture is 22 eV, for example. Accordingly, it is advantageous if the Wien filter can be energized strongly accordingly to achieve the best possible detection efficiency even with a proposed secondary electron cascade, because the pre-amplification achieved with the help of a secondary electron cascade, the resulting good detection efficiency at a great working distance and the enlargement of the field-of-view at a great working distance are not limited to the embodiment from FIG. 7 but instead are also achieved in the other embodiments in operation with a single-pole lens.

Because of the high primary energy, the field curvature produced by applying a voltage between the lower pressure stage aperture and the specimen in the area of the lower pressure stage aperture orifice 16 seems noncritical for the resolution. Because of the relatively high energy of the secondary electrons and because of the great excitation of the single-pole lens, it also seems uncritical for the detection efficiency. However, if this field curvature within the lower pressure stage aperture 18 is to be suppressed, this can easily be accomplished with an auxiliary electrode 13, such as that illustrated in FIGS. 4 and 6. Since the auxiliary electrode 13 is set at a positive voltage with respect to the lower pressure stage aperture 18, the electric field strength can be made so low within the lower pressure stage aperture orifice 16, the electric field strength within the lower pressure stage aperture orifice 16 can be made so low that it no longer causes interference. The resulting region with a low electric field strength in front of the pressure stage aperture orifice 16 also reduces the mean secondary electron energy, which is positive for the detection. However, the gain of the secondary electron cascade is somewhat weakened.

After the secondary electrons in FIG. 7 are deflected through the grid electrode 75, they are picked up by the suction field of the detector 51, as shown in FIG. 6, whose preferred voltage is between 1 and 20 kV.

It is advantageous that the pressure stage aperture 44 in FIGS. 6 and 7 is easily replaceable so that it can be taken out and replaced with no problem. It is also advantageous that a high magnetic flux density prevails inside the upper pressure stage aperture orifice 41, and the orifice 41 is preferably so large that not only all the secondary electrons but also most of the backscatter electrons which are not shaded by the lower pressure stage aperture 18 can pass through the orifice 41. Another preferred modification of the embodiments from FIGS. 6 and 7, which allow an especially large diameter of the lower pressure stage aperture orifice 16, consists of the fact that the upper pressure stage aperture orifice 41 is equal to or smaller than the lower pressure stage aperture orifice 16. An additional aperture whose orifice diameter is equal to or larger than the orifice diameter of the upper pressure stage aperture 44 is mounted just beneath the upper pressure stage aperture 44 (at a distance of 100 μm, for example, but no more than 1 mm). The intermediate space between the two apertures is connected to a controllable gas supply through which ozone, for example, enters. The ozone partial pressure at the point of the pressure stage aperture orifice 41 differs from the partial pressure of water vapor there in operation by the maximum allowed gas pressure in the specimen chamber by a factor of less than 100, preferably by a factor of less than 20. If desirable, the upper pressure stage aperture 44 in this example may also be used as an aperture orifice at the same time.

Mount 19 of the upper pressure stage aperture in FIG. 7 is mounted in an easily dismantled manner on the electrode 67, by which the pressure stage aperture 44 is also contacted. The lower pressure stage aperture 18 is mounted on the pole shoe 58 in an easily dismantled manner. The intermediate space between the two pressure stage apertures is evacuated with the help of a corrugated tube 63, which may be flange connected in the specimen chamber in an easily dismantled manner, for example. The corrugated tube 63 prevents tilting of the specimen in only one direction, so the specimen can be tilted in all directions if it is first rotated accordingly.

An advantageous modification of FIG. 7 consists of the fact that another single-pole lens 64 with the pole shoe gap opened toward the top is also arranged beneath the specimen, as is known from scanning transmission electron microscopes or scanning electron microscopes with "in-lens operation." In addition to the reduced error coefficient, the advantage consists mainly of an increased magnetic flux density at the location of the specimen. This achieves the result that even at the sam potential on both pressure stage apertures 18 and 44, only a very few secondary electrons are forced to reverse their direction due to the increasing magnetic flux density. A preferred embodiment in combination with this is that the two pressure stage apertures are part of a common insert 26, as illustrated in FIG. 6. Another preferred modification of the embodiment illustrated in FIG. 7 consists of the fact that detection takes place beneath the counter-electrode 78 through a bore in the pole shoe 58 through which the suction field of the detector 51 attracts the secondary electrons. No additional magnetic field 80 is necessary here.

In FIG. 1, the only secondary electrons detected are those which are a sufficiently great distance away from the optical axis 79 on reaching the detector 74 so that they do not fly through the orifice 77 of the detector. The remaining secondary electrons fly through the orifice 77 of the detector. To increase the detection efficiency of the pressure SEM, these secondary electrons 86 are also detected in the embodiment of FIG. 8. To do so, an additional upper detector 91 is also mounted just beneath the aperture orifice 94. The electrode 55 is extended toward the top beyond the aperture orifice, and the aperture orifice 94 and the detector 91 are at the potential of the electrode 55. Because of the small design size, it is advantageous to use a semiconductor detector (with a downstream optical coupler) as the upper detector 91.

The lower detector 74 and the aperture orifice 94 are also used as pressure stage apertures at the same time. Between the pressure stage apertures 44, 74 and 94 and above the pressure stage aperture 94, the space is pumped out through orifices 73, 76 and 98, as indicated by arrows. An electromagnetic aperture orifice changer is advantageous when the aperture orifice 94 is used as a pressure stage aperture, because then the aperture orifice need not be movable.

FIG. 9 shows another variant of a pressure SEM according to this invention with an additional upper detector 91, which is designed here as a combination with aperture orifice 94. A preferred embodiment consists of using semiconductor material for the combined part, where the semiconductor material may be etched away in the area around the optical axis 79 except for a small thickness (<100 μm), so that the aperture orifices have only a short length. A metal coating is applied from above to act as the aperture orifice 94, and from beneath the combined part is designed as a semiconductor detector 91. A preferred embodiment of the upper detector 91 combined with the aperture orifice 94 consists of the fact that an ultra-high vacuum prevails above the aperture orifice 94 so that the aperture orifice need not be heated.

In FIG. 9, the primary electron beam emitted by the cathode 99 is threaded through the desired orifice in the aperture 94 with the help of an electromagnetic aperture changer. Beneath the detector 91 the primary electron beam 82 is deflected back to the optical axis by magnetic fields 80 and 83. The next path is the same for the primary electrons and the secondary electrons as that in FIG. 1. With the design illustrated in FIG. 9, the secondary electrons 85 (and backscatter electrons with low energy losses) which fly along the optical axis through the orifice 77 of the lower detector, deflected from the optical axis by magnetic fields 80 and 83 and guided to the upper detector 91.

The additional upper detector 91 illustrated in FIGS. 8 and 9 can be combined with the embodiments from FIGS. 2 through 5 and with any corpuscular beam device where the primary corpuscular beam passes close by the edge of the detector 74 (e.g., through an orifice 77 in the detector) and where there is an electric field between the specimen 11 and the detector 74, accelerating the secondary corpuscular particles in the direction of the detector 74. Detection of the secondary electrons or secondary corpuscular particles passing by the edge of the lower detector 74 (e.g., through an orifice 77 in the detector) causes an increase in detection efficiency in operation with gas in the specimen chamber and also in vacuum operation.

In operation with a vacuum in the specimen chamber without the pressure stage apertures 18 and 44, the additional upper detector 91 produces a great improvement in detection efficiency when the secondary electrons are focused on the orifice 77 of the lower detector under unfavorable operating conditions. In addition, the improvement in detection efficiency also has a positive effect for the center of the image of images with a low magnification. When recording images with the lower detector 74 at a low magnification, a dark area falls in the center of the image, caused by the fact that more secondary electrons pass through the orifice 77 in the lower detector for specimen sites near the axis than for specimen sites far away from the axis. This negative effect is eliminated when the signal of the upper detector 91, which originates from the secondary electrons flying through the orifice 77 in the lower detector, is added to the signal of the lower detector 74. In addition, the additional upper detector 91 supplies a very valuable additional signal in vacuum operation. It is generated in particular by the secondary electrons which are emitted by the specimen at small angles to the optical axis and therefore cannot be detected by the lower detector 74, but instead fly through its orifice 77. These electrons are necessary for investigation of deep holes and highly fissured structures for which the additional upper detector is ideally suitable. Of all the specimen locations, this detector detects only the secondary electrons emitted at a small angle to the optical axis, so the bottom of a deep hole appears just as bright as elevated specimen sites. To detect secondary electrons with different starting angles separately in vacuum operation, the detector 91 may be divided into several particle-sensitive areas which may be arranged concentrically with the optical axis, for example. The same advantages are also obtained when using the additional upper detector in a corpuscular radiation device.

For the embodiments with a combined electrostatic and magnetic lens, where the magnetic field of the single-pole lens 64 is not in operation and therefore the secondary electrons must be focused electrostatically on the upper pressure stage aperture orifice 41, there is a worsening of resolution and detection efficiency for large distances between the specimen 11 and the pressure stage orifice 18. However, this operating status can be largely prevented by the combination with other detectors that are very suitable for large working distances. The electric field between the electrodes 18 and 44 (or 18 and 39 in FIGS. 3 and 5) forms an electrostatic lens for pressure SEMs according to this invention without a magnetic single-pole lens, causing a worsening of resolution at a great distance from the specimen 11. This can be prevented by turning off the electrostatic lens in operation at a great working distance and can be focused by a purely magnetic mechanism. To do so, the electrodes 18, 25, 44 (or 39 and 43 in FIGS. 3 and 5), 50 and 55 are all at the same potential. Then for operation with gas in the specimen chamber, a collector electrode detector (International Patent applications WO 88/09564 A1, WO 90/04261 A1) or a gas scintillation detector is used, and for operation with a vacuum in the specimen chamber, an Everhardt-Thornley detector mounted at the side is used. The pressure stage aperture 18 and/or a collector electrode 13 insulated with respect to it such as that illustrated in FIG. 4, for example, is used as the collector electrode. Then the same signal-to-noise ratio as that achieved with the pressure SEMs known today can be achieved with the collector electrode detector for which favorable operating conditions prevail with a great distance between the specimen 11 and the pressure stage orifice 18.

Purely magnetic focusing, where electrode 55 is placed at a potential close to that of ground (<1000 V), is possible for primary energies of less than or equal to approximately 5 keV even when using a field emission cathode or a Schottky emitter without any significant loss of resolution (because the extraction electrode is at a strongly positive potential only at a primary energy less than approximately 5 kev). In operation with gas in the specimen chamber, this restriction to a high primary energy is not at all noticeable because with a typical gas pressure of 10 hPa, for example, only a primary energy of >5 keV may be used anyway for greater distances between the specimen 11 and the pressure stage orifice 18.

An advantageous embodiment of the pressure SEMs according to this invention which produces a great increase in the field-of-view at a great distance between the specimen 11 and the pressure stage orifice 18 consists of the fact that instead of the deflector coils 59, a double deflector element is used. The position of the scanning center on the optical axis can be selected freely in this way. The largest possible field-of-view is achieved when scanning is performed around a point between the two pressure stage apertures 18 and 44, its position on the optical axis 79 being selected so that the field-of-view is limited by the lower pressure stage aperture 18 as well as the upper pressure stage aperture 44 above it.

For embodiments of the pressure SEMs according to this invention which operate at high pressure in the specimen chamber ($\geq$100 hPa) or at a very low primary energy (<1 keV at a water vapor pressure of 10 hPa, for example), there are restrictions for the working distance and the field-of-view due to the fact that small distances (<300 $\mu$m) between the specimen 11 and the pressure stage orifice 18 and a small diameter (<300 $\mu$m) of the orifice 16 are absolutely essential here. Contact between the specimen 11 and the pressure stage orifice 18 when moving the specimen stand can be avoided reliably by operating with gas in the specimen chamber after surveying the topography of the specimen.

The restriction in the field-of-view due to the pressure stage aperture orifice 16 can be compensated by the designs of the pressure SEMs according to this invention as described below. A preferred embodiment consists of a combination with a computer-controlled specimen stand and image processing which makes it possible to assemble several individual electron micrographs ti form one larger image. Another preferred embodiment consists of integrating a reflected light microscope or a confocal laser microscope into the specimen chamber. Then before investigation with the electron beam, this microscope is used to record a survey image of the specimen which is already mounted on the specimen stand and this image is then stored in the computer. With the help of the computer, locations can be marked to be approached subsequently by the computer-controlled specimen stand for examination by the scanning electron microscope. Such light microscope survey images make scanning electron microscopic survey images in the pressure SEM unnecessary for most applications.

If the topography of the specimen is also surveyed at the same time with the reflected light microscope or the confocal laser microscope and stored by the computer, then the working distance can also be adjusted by the computer without any additional distance control in the following examination with the electron beam, and contact between the specimen 11 and the pressure stage orifice 18 in the movement of the specimen stand can be avoided reliably.

What is claimed is:

1. A scanning electron microscope having a microscope column and an optical axis, wherein said column comprises:

a beam source capable of producing a primary electron beam;

a specimen chamber;

one or more pressure stage apertures disposed between the beam source and the specimen chamber, wherein each said aperture comprises an orifice through which the primary electron beam can be deflected onto a specimen within the specimen chamber;

at least one highly-sensitive detector having a bias potential with respect to a specimen, wherein said detector is capable of signal multiplication and the sensitivity is higher than the sensitivity of a collector electrode; and in which a lowest pressure stage aperture, disposed nearest the specimen, is adapted to shield an elevated pressure in the specimen chamber with respect to the remaining microscope column and is further adapted to allow secondary electrons from the specimen to pass through the orifice of the pressure stage aperture to contact said at least one detector.

2. The scanning electron microscope of claim 1 further comprising at least one electrode disposed above the lowest pressure stage aperture, wherein said electrode is at a positive potential with respect to said lowest pressure stage aperture and is adapted to deflect the secondary electrons from the specimen to the detector.

3. The scanning electron microscope of claim 1 which said at least one pressure stage aperture has a top side and a bottom side and is comprised of layers of at least two conductive layers that are electrically insulated from one another and said aperture, wherein potentials can be applied to said conductive layers such that there is a potential difference between the a top side and the a bottom side of a respective pressure stage aperture.

4. The scanning electron microscope of claim 2 or claim 3 in which the electrodes are arranged concentrically about the optical axis of the scanning electron microscope.

5. The scanning electron microscope of claim 2 which at least one part of the surface of the detector is at a potential which is positive by more than 1000 V with respect to the potential of at least one area of the specimen.

6. The scanning electron microscope of claim 2 in which one or more electrodes disposed above the pressure stage aperture form additional pressure stage apertures, wherein said microscope further comprises pumping means that generate low pressures in the intermediate spaces between the pressure stage apertures.

7. The scanning electron microscope of claim 6 which at least one electrode comprising said additional pressure stage aperture has an orifice having a characteristic dimension of less than 1500 $\mu$m.

8. The scanning electron microscope of claim 2 in which a component design is provided where the parts required for microscope operation at an elevated pressure in the specimen chamber form one or more assembly groups that can be dismantled easily in the specimen chamber.

9. The scanning electron microscope of claim 2 comprising:

a first detector having an outer edge and/or an inner orifice, disposed with said outer edge or said inner orifice adjacent to the primary electron beam, and a second detector behind an edge or the orifice of said first detector with respect to the direction of movement of the secondary electrons and which is adapted for detection of secondary electrons which pass though the orifice or past the edge.

10. The scanning electron microscope of claim 2 in which the secondary electrons arc deflected from the optical axis by a magnetic field.

11. The scanning electron microscope of claim 1 in which the surface of the detector is at a potential which is positive by more than 1000 V with respect to the potential of at least one area of the specimen.

12. The scanning electron microscope of claim 1 in which a component assembly is provided, where only parts necessary for microscope operation at an elevated pressure in the specimen chamber form one or more assembly groups that can be dismantled easily in the specimen chamber.

13. The scanning electron microscope of claim 1, further comprising a magnetic field between the specimen and the lower pressure stage aperture, in which said magnetic field has rotational symmetry with respect to the optical axis and whereby the transport of the secondary electrons from the specimen to the orifice in the pressure stage aperture is improved.

14. The scanning electron microscope of claim 1, further comprising a magnetic field capable of deflecting the secondary electrons in the direction of the detector.

15. A method of recording scanning electron microscopic images under an elevated pressure, said method comprising providing a specimen in the specimen chamber of the electron microscope of claim 1 and recording an electron microscopic image of said specimen.

16. A scanning electron microscope having a microscope column and an optical axis, wherein said column comprises:
   a beam source capable of producing a primary electron beam;
   a specimen chamber;
   one or more pressure stage apertures disposed between the beam source and the specimen chamber, wherein each said aperture comprises an orifice through which the primary electron beam can be deflected onto a specimen within the specimen chamber;
   at least one highly-sensitive detector having a bias potential with respect to the specimen, wherein said detector is capable of signal multiplication and the sensitivity is higher than the sensitivity of a collector electrode;
   at least one electrode disposed above a lowest pressure stage aperture, disposed nearest the specimen, wherein said electrode is at a positive potential with respect to said lowest pressure stage aperture and is adapted to deflect secondary electrons from the specimen to the detector;
   in which the lowest pressure stage aperture is adapted to shield an elevated pressure in the specimen chamber with respect to the remaining microscope column of the scanning electron microscope and is further adapted to allow secondary electrons from the specimen to pass through the orifice of the pressure stage aperture to contact said at least one detector; and
   in which the pressure stage aperture and/or electrodes above it form one or more electrostatic lenses which are adapted for focusing the primary electron beam in an electric field between the pressure stage aperture and the electrodes above it or between the respective electrodes above it.

17. The scanning electron microscope of claim 16, in which at least one part of the surface of the detector is at a potential which is positive by more than 500 V with respect to the potential of at least one area of the specimen.

18. The scanning electron microscope of claim 16, in which one or more electrodes disposed above the pressure stage aperture form additional pressure stage apertures, wherein said microscope further comprises pumping means that generate low pressures in intermediate spaces between the pressure stage apertures.

19. The scanning electron microscope of claim 16, in which at least one electrode comprising said additional pressure stage aperture has an orifice having a characteristic dimension of less than 1500 µm.

20. The scanning electron microscope of claim 16, further comprising:
   a first detector having an outer edge and/or an inner orifice, disposed with said outer edge or said inner orifice adjacent to the primary electron beam, and
   a second detector behind an edge or the orifice of said first detector with respect to the direction of movement of the secondary electrons and which is adapted for detection of secondary electrons which pass through the orifice or past the edge.

21. A scanning electron microscope having a microscope column and an optical axis, wherein said column comprises:
   a beam source capable of producing a primary electron beam;
   a specimen chamber;
   at least one pressure stage aperture disposed between the beam source and the specimen chamber, wherein each said aperture comprises an orifice through which a primary electron beam can be deflected onto a specimen within the specimen chamber, and at least one highly-sensitive detector having a bias potential with respect to the specimen, wherein said detector is capable of signal multiplication and the sensitivity is higher than the sensitivity of a collector electrode;
   in which said at least one pressure stage aperture has a top side and a bottom side and is comprised of layers of at least two conductive layers that are electrically insulated from one another and said aperture, wherein potentials can be applied to said conductive layers such that there is a potential difference between a top side and a bottom side of a respective pressure stage aperture;
   in which a lowest pressure stage aperture, disposed nearest the specimen, is adapted to shield an elevated pressure in the specimen chamber with respect to the remaining microscope column of the scanning electron microscope and is farther adapted to allow secondary electrons from the specimen to pass through the orifice of the pressure stage aperture to contact said at least one detector; and
   in which the pressure stage aperture and/or electrodes above it form one or more electrostatic lenses which are adapted for focusing the primary electron beam in an electric field between the pressure stage aperture and the electrodes above it or between the respective electrodes above it.

22. The scanning electron microscope of claim 21, in which at least one part of the surface of the detector is at a potential which is positive by more than 500 V with respect to the potential of at least one area of the specimen.

23. The scanning electron microscope of claim 21, in which one or more electrodes disposed above the pressure stage aperture form additional pressure stage apertures, wherein said microscope further comprises pumping means that generate low pressures in intermediate spaces between the pressure stage apertures.

24. The scanning electron microscope of claim 21, further comprising:
   a first detector having an outer edge and/or an inner orifice, disposed with said outer edge or said inner orifice adjacent to the primary electron beam, and
   a second detector behind an edge or the orifice of said first detector with respect to the direction of movement of the secondary electrons and which is adapted for detection of secondary electrons which pass though the orifice or past the edge.

25. A scanning electron microscope having a microscope column and an optical axis, wherein said column comprises:
   a beam source capable of producing a primary electron beam;
   a specimen chamber;
   one or more pressure stage apertures disposed between the beam source and the specimen chamber, wherein each said aperture comprises an orifice though which the primary electron beam can be deflected onto a specimen within the specimen chamber,
   at least one highly-sensitive detector having a bias potential with respect to the specimen, wherein said detector is capable of signal multiplication and the sensitivity is higher than the sensitivity of a collector electrode,
   at least one electrode disposed above a lowest pressure stage aperture, disposed nearest the specimen, wherein said electrode is at a positive potential with respect to said lowest pressure stage aperture and is adapted to deflect the secondary electrons from the specimen to the detector, and
   in which the lowest pressure stage aperture is adapted to shield an elevated pressure in the specimen chamber with respect to the remaining microscope column of the scanning electron microscope and is further adapted to allow secondary electrons from the specimen to pass through the orifice of the pressure stage aperture to contact said at least one detector, and
   in which a combined electrostatic and magnetic lens is provided.

26. The scanning electron microscope of claim 25, in which at least one part of the surface of the detector is at a potential which is positive by more than 500 V with respect to the potential of at least one area of the specimen.

27. The scanning electron microscope of claim 25, in which one or more electrodes disposed above the pressure stage aperture form additional pressure stage apertures, wherein said microscope further comprises pumping means that generate low pressures in the intermediate spaces between the pressure stage apertures.

28. A scanning electron microscope having a microscope column and an optical axis, wherein said column comprises:
   a beam source capable of producing a primary electron beam;
   a specimen chamber;
   one or more pressure stage apertures disposed between the beam source and thc specimen chamber, wherein each said aperture comprises an orifice through which the primary electron beam can be deflected onto a specimen within the specimen chamber,
   at least one highly-sensitive detector having a bias potential with respect to a specimen, wherein said detector is capable of signal multiplication and the sensitivity is higher than the sensitivity of a collector electrode, and
   in which a lowest pressure stage aperture, disposed nearest the specimen, is adapted to shield an elevated pressure in the specimen chamber wit respect to the remaining microscope column of the scanning electron microscope and is further adapted to allow secondary electrons from the specimen to pass through the orifice of the pressure stage aperture to contact said at least one detector, and
   in which the secondary electrons pass through at least two pressure stage aperture orifices on their path to the detector, with a magnetic field prevailing in at least one of these orifices such that all magnetic field lines running through the lower pressure stage aperture also pass through the upper pressure stage aperture.

29. The scanning electron microscope of claim 28, further comprising at least one electrode disposed above the lowest pressure stage aperture, wherein said electrode is at a positive potential with respect to said lowest pressure stage aperture and is adapted to deflect the secondary electrons from the specimen to the detector.

30. The scanning electron microscope of claim 28, in which at least one part of the surface of the detector is at a potential which is positive by more than 500 V with respect to the potential of at least one area of the specimen.

31. The scanning electron microscope of claim 28, in which one or more electrodes disposed above the pressure stage aperture form additional pressure stage apertures, wherein said microscope further comprises pumping means that generate low pressures in the intermediate spaces between the pressure stage apertures.

32. The scanning electron microscope of claim 28, in which at least one electrode comprising said additional pressure stage aperture has an orifice having a characteristic dimension of less than 1500 μm.

33. The scanning electron microscope of claim 28, in which a component assembly is provided, where only parts necessary for microscope operation at an elevated pressure in the specimen chamber form one or more assembly groups that can be dismantled easily in the specimen chamber.

34. The scanning electron microscope of claim 28, further comprising:
   a first detector having an outer edge and/or an inner orifice, disposed with said outer edge or said inner orifice adjacent to the primary electron beam, and
   a second detector behind an edge or the orifice of said first detector with respect to the direction of movement of the secondary electrons and which is adapted for detection of secondary electrons which pass through the orifice or past the edge.

35. The scanning electron microscope of claim 28, which the surface of the detector is at a potential which is positive by more than 1000 V with respect to the potential of at least one area of the specimen.

36. The scanning electron microscope of claim 28, further comprising a magnetic field between the specimen and the lower pressure stage aperture, in which said magnetic field has rotational symmetry with respect to the optical axis and whereby the transport of the secondary electrons from the specimen to the orifice in the pressure stage aperture is improved.

37. The scanning electron microscope of claim 28, further comprising a magnetic field capable of deflecting the secondary electrons in the direction of the detector.

38. A scanning electron microscope having a microscope column and an optical axis, wherein said column comprises:
   a beam source capable of producing a primary electron beam;
   a specimen chamber;
   one or more pressure stage apertures disposed between the beam source and the specimen chamber, wherein each said aperture comprises an orifice through which the primary electron beam can be deflected onto a specimen within the specimen chamber,
   at least one highly-sensitive detector having a bias potential with respect to a specimen, wherein said detector is capable of signal multiplication and the sensitivity is higher than the sensitivity of a collector electrode, and in which a lowest pressure stage aperture, disposed nearest the specimen, is adapted to shield an elevated pressure in the specimen chamber with respect to the remaining microscope column of the scanning electron microscope and is further adapted to allow secondary electrons from the specimen to pass through the orifice of the pressure stage aperture to contact said at least one detector, and in which a counter-electrode is adapted to decelerate the secondary electrons and thereby support a transport of the secondary electrons to the detector.

39. The scanning electron microscope of claim 38, further comprising at least one electrode disposed above the lowest pressure stage aperture, wherein said electrode is at a positive potential with respect to said lowest pressure stage aperture and is adapted to deflect the secondary electrons from the specimen to the detector.

40. The scanning electron microscope of claim 38, in which at least one part of the surface of the detector is at a potential which is positive by more than 500 V with respect to the potential of at least one area of the specimen.

41. The scanning electron microscope of claim 38, in which one or more electrodes disposed above the pressure stage aperture form additional pressure stage apertures, wherein said microscope further comprises pumping means that generate low pressures in intermediate spaces between the pressure stage apertures.

42. The scanning electron microscope of claim 38, further comprising:
a first detector having an outer edge and/or an inner orifice, disposed with said outer edge or said inner orifice adjacent to the primary electron beam, and
a second detector behind an edge or the orifice of said first detector with respect to the direction of movement of the secondary electrons and which is adapted for detection of secondary electrons which pass through the orifice or past the edge.

43. The scanning electron microscope of claim 38, in which the surface of the detector is at a potential which is positive by more than 1000 V with respect to the potential of at least one area of the specimen.

44. The scanning electron microscope of claim 38, in which a component assembly is provided, where only the parts necessary for microscope operation at all elevated pressure in the specimen chamber form one or more assembly groups that can be dismantled easily in the specimen chamber.

45. The scanning electron microscope of claim 38, further comprising a magnetic field between the specimen and the lower pressure stage aperture, in which said magnetic field has rotational symmetry with respect to the optical axis and whereby the transport of the secondary electrons from the specimen to the orifice in the pressure stage aperture is improved.

46. The scanning electron microscope of claim 38, further comprising a magnetic field capable of deflecting the secondary electrons in the direction of the detector.

47. A scanning electron microscope having a microscope column and an optical axis, wherein said column comprises:
a beam source capable of producing a primary electron beam;
a specimen chamber;
one or more pressure stage apertures disposed between the beam source and the specimen chamber, wherein each said aperture comprises an orifice through which the primary electron beam can be deflected onto a specimen within the specimen chamber, at least one highly-sensitive detector having a bias potential with respect to a specimen, wherein said detector is capable of signal multiplication and the sensitivity is higher than the sensitivity of a collector electrode, and a magnetic lens focusing said primary electron beam, said magnetic lens having a specimen side pole shoe end, said specimen side pole shoe end having a cathode side and a specimen side, and in which a lowest pressure stage aperture, disposed nearest the specimen, is adapted to shield an elevated pressure in the specimen chamber with respect to the remaining microscope column of the scanning electron microscope and is farther adapted to allow secondary electrons from the specimen to pass though the orifice of the pressure stage aperture to contact said at least one detector, and in which said detector being disposed on said cathode side of said specimen side pole shoe end of said magnetic lens.

48. The scanning electron microscope of claim 47, further comprising at least one electrode disposed above the lowest pressure stage aperture, wherein said electrode is at a positive potential with respect to said lowest pressure stage aperture and is adapted to deflect the secondary electrons from the specimen to the detector.

49. The scanning electron microscope of claim 47 in which said at least one pressure stage aperture has a top side and a bottom side and is comprised of layers of at least two conductive layers that are electrically insulated from one another and said aperture, wherein potentials can be applied to said conductive layers such that there is a potential difference between a top side and a bottom side of a respective pressure stage aperture.

50. The scanning electron microscope of claim 48 or 49 in which the electrodes are arranged concentrically about the optical axis of the scanning electron microscope.

51. The scanning electron microscope of claim 48, in which at least one part of the surface of the detector is at a potential which is positive by more than 1000 V with respect to the potential of at least one area of the specimen.

52. The scanning electron microscope of claim 48, in which one or more electrodes disposed above the pressure stage aperture form additional pressure stage apertures, wherein said microscope further comprises pumping means that generate low pressures in the intermediate spaces between the pressure stage apertures.

53. The scanning electron microscope of claim 52, in which at least one electrode comprising said additional pressure stage aperture has an orifice having a characteristic dimension of less than 1500 μm.

54. The scanning electron microscope of claim 48, in which a component design is provided where parts required for microscope operation at an elevated pressure in the specimen chamber form one or more assembly groups that can be dismantled easily in the specimen chamber.

55. The scanning electron microscope of claim 48, comprising:
a first detector having an outer edge and/or an inner orifice, disposed with said outer edge or said inner orifice adjacent to the primary electron beam,
a second detector behind an edge or the orifice of said first detector with respect to the direction of movement of the secondary electrons and which is adapted for detection of secondary electrons which pass though the orifice or past the edge.

56. The scanning electron microscope of claim 48, in which the secondary electrons are deflected from the optical axis by a magnetic field.

57. The scanning electron microscope of claim 47, in which the surface of the detector is at a potential which is positive by more than 1000 V with respect to the potential of at least one area of the specimen.

58. The scanning electron microscope of claim 47, in which a component assembly is provided, where only parts necessary for microscope operation at an elevated pressure in the specimen chamber form one or more assembly groups that can be dismantled easily in the specimen chamber.

59. The scanning electron microscope of claim 47, further comprising a magnetic field between the specimen and the lower pressure stage aperture, in which said magnetic field has rotational symmetry with respect to the optical axis and whereby the transport of the secondary electrons from the specimen to the orifice in the pressure stage aperture is improved.

60. The scanning electron microscope of claim 47, further comprising a magnetic field capable of deflecting the secondary electrons in the direction of the detector.

61. A method of recording scanning electron microscopic images under an elevated pressure, said method comprising providing a specimen in the specimen chamber of the electron microscope of claim 47 and recording an electron microscopic image of said specimen.

62. The scanning electron microscope of claim 47, which the pressure stage aperture and/or electrodes above it form one or more electrostatic lenses which are adapted for focusing the primary electron beam in the electric field between the pressure stage aperture and the electrodes above it or between the respective electrodes above it.

63. The scanning electron microscope of claim 47, in which a combined electrostatic and magnetic lens is provided.

64. The scanning electron microscope of claim 47, in which the secondary electrons pass through at least two pressure stage aperture orifices on their path tote detector, with a magnetic field prevailing in these orifices such that all the magnetic field lines running through the lower pressure stage aperture also pass through the upper pressure stage aperture.

65. The scanning electron microscope of claim 49, in which a counter-electrode is adapted to decelerate the secondary electrons and thereby support the transport of the secondary electrons to the detector.

* * * * *